(12) United States Patent
Visokay et al.

(10) Patent No.: US 7,531,400 B2
(45) Date of Patent: May 12, 2009

(54) METHODS FOR FABRICATING MOS TRANSISTOR GATES WITH DOPED SILICIDE

(75) Inventors: Mark Visokay, Richardson, TX (US); Luigi Colombo, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 61 days.

(21) Appl. No.: 11/556,480

(22) Filed: Nov. 3, 2006

(65) Prior Publication Data

US 2007/0059872 A1  Mar. 15, 2007

Related U.S. Application Data

(62) Division of application No. 10/674,771, filed on Sep. 30, 2003, now Pat. No. 7,148,546.

(51) Int. Cl.
*H01L 21/336* (2006.01)
(52) U.S. Cl. .............................. 438/199; 257/E27.108
(58) Field of Classification Search .......... 257/E27.108, 257/E27.064, E27.046
See application file for complete search history.

(56) References Cited

U.S. PATENT DOCUMENTS

| | | | |
|---|---|---|---|
| 4,628,588 A | 12/1986 | McDavid | |
| 4,641,417 A | 2/1987 | McDavid | |
| 4,672,419 A | 6/1987 | McDavid | |
| 4,954,867 A | 9/1990 | Hoska | |
| 5,633,522 A | 5/1997 | Dorleans et al. | |
| 5,723,893 A | 3/1998 | Yu et al. | |
| 5,744,845 A * | 4/1998 | Sayama et al. | 257/371 |
| 5,937,315 A | 8/1999 | Xiang et al. | |
| 6,204,103 B1 | 3/2001 | Bai et al. | |
| 6,376,342 B1 | 4/2002 | Tseng | |
| 6,410,967 B1 | 6/2002 | Hause et al. | |
| 6,432,817 B1 | 8/2002 | Bertrand et al. | |
| 6,602,781 B1 | 8/2003 | Xiang et al. | |
| 6,617,624 B2 | 9/2003 | Powell | |
| 6,645,798 B2 * | 11/2003 | Hu | 438/197 |
| 2005/0064690 A1 * | 3/2005 | Amos et al. | 438/592 |
| 2005/0250268 A1 * | 11/2005 | Fukada et al. | 438/180 |
| 2006/0017107 A1 * | 1/2006 | Hu | 257/351 |

OTHER PUBLICATIONS

"Mo2N/Mo GAFP MOSFETs" Manjin J. Kim and Dale M Brown, IEEE, 1982, pp. 560-563.

"Application of MoSi2 to the Double-Level Interconnections of I2L Circuits"Sasaki et al, IEEE Transactions on Electron Devices, vol. ED-27, No. 8, Aug. 1989, 5 pgs.

(Continued)

*Primary Examiner*—Thao Le
(74) *Attorney, Agent, or Firm*—Yingsheng Tung; Wade J. Brady, III; Frederick J. Telecky, Jr.

(57) ABSTRACT

Semiconductor devices and fabrication methods are presented, in which transistor gate structures are created using doped metal silicide materials. Upper and lower metal silicides are formed above a gate dielectric, wherein the lower metal silicide is doped with n-type impurities for NMOS gates and with p-type impurities for PMOS gates, and wherein a silicon may, but need not be formed between the upper and lower metal silicides. The lower metal silicide can be deposited directly, or may be formed through reaction of deposited metal and poly-silicon, and the lower silicide can be doped by diffusion or implantation, before or after gate patterning.

20 Claims, 15 Drawing Sheets

OTHER PUBLICATIONS

"Work Function Controlled Silicide Technology for Submicron CMOS" Kakumu et al. Source and date unknown, 2 pgs.

"Refractory Metal Silidice/N+Polysilicon in CMOS/SOS" Leung et al. Source and date unknown, 4 pgs.

"Fabrication of Mo-Gate/TI Silicide-Clad-Moat MOS Devices by Use of Multilayer-Glass Depositions", J. M. McDavid, IEEE Electron Device Letters, vol. EDL-5, No. 9, Sep. 1984, 2 pgs.

Lightly Impurity Doped (LD) Mo Silicide Gate Technology, Kakumu et al, IEEE 1985, pp. 415-418.

"An Investigation of Molybdenum Gate for Submicrometer CMOS", Kwasnick et al, IEEE Transactions on Electron Devices, vol. 35, No. 9, Sep. 1988, 7 pgs.

"Electrical Characteristics of TiB2 for ULSI Applications" Chang Sik Choi et al., IEEE Transactions on Electron Devices, vol. 39, No. 10, Oct. 1992, pp. 2341-2345.

"Fin FET Process refinements for Improved Mobility and Gate Work Function Engineering" Yang-Kyu Choi et al, IEEE, 2002, 4 pgs.

"Silicon Processing for the VLSI Era, vol. 2: Process Integration" MOS Devices and NMOS Process Integration, Stanley Wolf PhD, 1990, 7 pgs.

* cited by examiner

METHODS FOR FABRICATING MOS TRANSISTOR GATES WITH DOPED SILICIDE

This is a divisional application of prior application Ser. No. 10/674,771 filed Sep. 30, 2003, the contents of which are herein incorporated by reference in its entirety.

FIELD OF INVENTION

The present invention relates generally to semiconductor devices and more particularly to doped silicide MOS transistor gates and fabrication methods for making the same.

BACKGROUND OF THE INVENTION

Field effect transistors (FETs) are widely used in the electronics industry for switching, amplification, filtering, and other tasks related to both analog and digital electrical signals. Most common among these are metal-oxide-semiconductor field-effect transistors (MOSFETs), wherein a gate contact or electrode is energized to create an electric field in a channel region of a semiconductor body, by which electrons are allowed to travel through the channel between a source region and a drain region of the semiconductor body. The source and drain regions are typically formed by adding dopants to targeted regions on either side of the channel. A gate dielectric or gate oxide is formed over the channel, and a gate electrode or gate contact is formed over the gate dielectric. The gate dielectric and gate electrode layers are then patterned to form a gate structure overlying the channel region of the substrate.

In operation of the resulting MOS transistor, the threshold voltage (Vt) is the gate voltage value required to render the channel conductive by formation of an inversion layer at the surface of the semiconductor channel. Complementary MOS (CMOS) devices have become widely used in the semiconductor industry, wherein both n-channel and p-channel (NMOS and PMOS) transistors are used to fabricate logic and other circuitry. For enhancement-mode (e.g., normally off) devices, the threshold voltage Vt is positive for NMOS and negative for PMOS transistors. The threshold voltage is dependent upon the flat-band voltage, where the flat-band voltage depends on the work function difference between the gate and the substrate materials, as well as on surface charge.

The work function of a material is a measure of the energy required to move an electron in the material outside of a material atom from the Fermi level, and is usually expressed in electron volts (eV). For CMOS products, it is desirable to provide predictable, repeatable, and stable threshold voltages for the NMOS and PMOS transistors. To establish Vt values, the work functions of the PMOS and NMOS gate contact and the corresponding channel materials are independently tuned or adjusted through gate and channel engineering, respectively.

Channel engineering typically involves shallow dopant implants to the prospective channel regions of the semiconductor body, sometimes referred to as threshold adjust (Vt adjust) implants, where the implanted impurities behave as a sheet of fixed charge located under the gate oxide. A Vt adjust implant for the NMOS devices introduces boron or other p-type impurities into the NMOS channel region to raise the channel work function (sometimes referred to as a VTN implant), and a Vt adjust implant for the PMOS devices introduces arsenic, phosphorus, or other n-type impurities to lower the PMOS channel work function (VTP implant). In this manner, the Vt for the channels can be separately adjusted for NMOS and PMOS devices. Channel engineering typically includes multiple implants, for example, a Vt adjust implant, a punch-thru implant to suppress punch-through, and a channel stop implant, for each of the NMOS and PMOS devices.

Gate engineering is employed in combination with channel engineering to adjust the work function of the gate contact materials, where different gate work function values are set for PMOS and NMOS gates. The need to independently adjust PMOS and NMOS gate work functions has made poly-silicon attractive for use as gate contact material in CMOS processes, since the work function of poly-silicon can be easily raised or lowered by doping the poly-silicon with p-type or n-type impurities, respectively. The PMOS poly-silicon gates are doped with p-type impurities and NMOS gate poly-silicon is doped with n-type dopants, typically during implantation of the respective source/drain regions following gate patterning. In this way, the final gate work functions are typically near the Si conduction band edge for NMOS and near the valence band for PMOS. The provision of dopants into the poly-silicon also has the benefit of increasing the conductivity of the gate contact. Poly-silicon has thusfar been widely using in the fabrication of CMOS devices, wherein the gate engineering (e.g., implants) are conventionally tuned to provide a desired gate contact conductivity (e.g., sheet resistance value), and the threshold voltage fine tuning is achieved by tailoring the Vt adjust implants to change the channel work function.

FIG. 1 illustrates a conventional CMOS fabrication process 10 beginning at 12, in which front end processing is performed at 14, including well formation and isolation processing. At 16 and 18, channel engineering is performed (e.g., Vt adjust, punch-thru, and channel stop implants) for PMOS and NMOS regions, respectively. A thin gate dielectric and an overlying poly-silicon are formed at 20 and 22, respectively, and the poly-silicon is patterned at 24 to form gate structures for the prospective NMOS and PMOS transistors. The gate structures are then encapsulated at 26, typically through oxidation, and highly-doped drain (HDD) implants are performed at 28 to provide p-type dopants to prospective source/drains of the PMOS regions and n-type dopants to source/drains of the NMOS regions, using the patterned gate structures and isolation structures as an implantation mask. Sidewall spacers are then formed at 30 along the lateral sidewalls of the gate structures At 32, the PMOS source/drain regions and the PMOS poly-silicon gate structures are implanted with p-type dopants to further define the PMOS source/drains, and to render the PMOS gates conductive. Similarly, the NMOS source/drain regions and the NMOS poly-silicon gate structures are implanted at 34 with n-type dopants, further defining the NMOS source/drains and to rendering the NMOS gates conductive. Thereafter, the source/drains and poly-silicon gates are silicided at 36 and back end processing (e.g., interconnect metalization, etc.) is performed at 38, before the process 10 ends at 40. In the conventional process 10, the channel engineering implants at 16 and 18 shift the work functions of the PMOS and NMOS channel regions, respectively, to compensate for the changes in the PMOS and NMOS poly-silicon gate work functions resulting from the source/drain implants at 32 and 34, respectively. In this manner, the desired work function difference between the gates and channels, and hence the desired threshold voltages, may be achieved for the resulting PMOS and NMOS transistors.

The gate dielectric or gate oxide between the channel and the gate contact is an insulator material, typically $SiO_2$ or other dielectric, that operates to prevent large currents from flowing from the gate contact into the channel when a voltage is applied to the gate electrode. The gate dielectric also allows an applied gate voltage to establish an electric field in the channel region in a controllable manner. Continuing trends in semiconductor product manufacturing include reduction in electrical device feature sizes (scaling), as well as improvements in device performance in terms of device switching speed and power consumption. MOS transistor performance may be improved by reducing the distance between the source and the drain regions under the gate electrode of the device, known as the gate or channel length, and by reducing the thickness of the layer of gate oxide that is formed over the semiconductor surface.

However, there are electrical and physical limitations on the extent to which $SiO_2$ gate dielectrics can be made thinner. These include gate leakage currents tunneling through the thin gate oxide, limitations on the ability to form very thin oxide films with uniform thickness, and the inability of very thin $SiO_2$ gate dielectric layers to prevent dopant diffusion from the gate poly-silicon into the underlying channel. Accordingly, recent scaling efforts have focused on high-k dielectric materials having dielectric constants greater than that of $SiO_2$, which can be formed in a thicker layer than scaled $SiO_2$, and yet which produce equivalent field effect performance. A thicker high-k dielectric layer can thus be formed to avoid or mitigate tunneling leakage currents, while still achieving the required electrical performance equivalent (e.g., capacitance value) of a thinner $SiO_2$.

Another shortcoming of scaled CMOS devices having poly-silicon gate contacts is known as poly-silicon depletion. Poly-silicon depletion occurs when annealing or other thermal back-end processing following the implants at 32 and 34 is insufficient to drive the implanted impurities down the entire depth of the poly-silicon gate structures. In this situation, a bottom portion of the poly-silicon gate contact near the gate dielectric is "depleted" of charges, and acts as an insulator. The depleted portion of the gate contact and the gate dielectric operate as series connected capacitors, resulting in a reduced effective gate capacitance, which reduces the drive current capability of the device. Consequently, poly-silicon depletion causes reduction in device performance which leads to poor unscalable devices. Simply increasing the implant energy and/or anneal time to combat poly-silicon depletion has adverse results, in that the corresponding depths of the concurrently implanted source/drain regions are increased.

With the relatively thick gate dielectrics and gate contact structures of the past, poly depletion was not critical to achieve desired device performance. However, as gate dielectrics and gate contacts continue to become smaller through scaling, the poly-silicon depletion problem is more pronounced, wherein poly-silicon depletion regions of 2 to 4 angstroms become a significant fraction of the overall effective gate capacitance. Thus, while poly-silicon gate contacts have previously offered flexibility in providing dual work functions for CMOS processes, the future viability of conventional poly-silicon gate technology is lessened as scaling efforts continue. Accordingly, attention has recently been directed again to the possibility of using metal gate contacts in CMOS products, where the metal gate materials conceivably do not need doping for conductivity improvement. Although this approach presumably avoids poly-silicon depletion issues with respect to gate capacitance, there remains a need for dual or differentiated work function capability (e.g., for PMOS and NMOS transistors) in CMOS processes. In this regard, metal work functions are not shifted as easily by the same amounts as was the case for poly-silicon. Accordingly, there is a need for improved CMOS transistor gate designs and fabrication techniques by which the benefits of scaling can be achieved while avoiding or mitigating the poly-silicon depletion degradation found in conventional devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention relates to semiconductor devices and fabrication methods, wherein transistor gate structures are created using doped metal silicide materials. A first metal silicide is formed above a gate dielectric and the silicide is doped with n-type impurities for NMOS gates or with p-type impurities for PMOS gates. The inventors have appreciated that the gate work function of the resulting NMOS and PMOS transistors can be successfully adjusted through appropriate doping the gate silicide, thereby facilitating elimination or simplification of channel engineering. The doped first metal silicide may comprise a refractory metal such as molybdenum, tungsten, tantalum, titanium, or others having a high melting temperature, and may be formed by direct silicide deposition or through reacting metal and silicon deposited above the gate dielectric. In this regard, a single starting material may be employed to form both PMOS and NMOS gate structures, thus avoiding process integration problems associated with using different gate materials. Dopants may be added to the first silicide through any means, such as direct implantation into a reacted or deposited silicide or implantation into unreacted metal and/or unreacted silicon followed by annealing to concurrently diffuse the dopants into the metal and to create the resulting metal silicide, where the dopants can be introduced before or after gate patterning.

The gate structures include a second upper metal silicide located above the doped first metal silicide. A silicon material may be provided between the first and second metal silicides, or the second metal silicide may overlie the doped first metal silicide thereby forming a silicide bilayer above the gate dielectric. In order to facilitate controlled dopant distribution within the doped first metal silicide for setting the gate work function (e.g., particularly at the gate dielectric interface), the first metal silicide may be relatively thin, wherein the provision of the upper silicide and/or the intervening silicon can advantageously reduce the gate contact sheet resistance. In one example, the first metal silicide is doped $MoSi_2$ where poly-silicon is formed over the doped metal silicide. The poly-silicon may also be doped, for example, via source/drain or other implantations, to render the poly-silicon conductive. A second silicide is then formed above the poly-silicon, wherein the poly-silicon may be reacted with a deposited second metal (e.g., nickel) to form the upper silicide. The upper silicide and the remaining poly-silicon may thus be of lower resistivity than the first metal silicide. In another example, the entire poly-silicon is reacted (e.g., consumed) in forming the upper silicide, whereby the gate stack includes a metal silicide bilayer.

In accordance with an aspect of the invention, a method is provided for fabricating PMOS and NMOS gate structures in a semiconductor device. The method comprises forming a gate dielectric, forming an n-doped first metal silicide above the gate dielectric in an NMOS region, and forming a p-doped first metal silicide above the gate dielectric in the PMOS region. The method further comprises forming a second metal silicide above the doped first metal silicide in the NMOS and PMOS regions. The first and second metal silicides may be different, for example, where the lower silicide includes a refractory metal (e.g., molybdenum, tungsten, tantalum, titanium, etc.) and the upper silicide includes nickel, and the method may further comprise forming silicon between the first and second metal silicides in the NMOS and PMOS regions.

Another aspect of the invention provides a semiconductor device comprising NMOS and PMOS gate structures. The NMOS gate structure comprises a gate dielectric above a semiconductor body, an n-doped first metal silicide structure above the gate dielectric, and a second metal silicide above the n-doped first metal silicide. The PMOS gate structure comprises a gate dielectric above a semiconductor body, a p-doped first metal silicide structure above the gate dielectric, and a second metal silicide above the p-doped first metal silicide. In one implementation, the device further comprises silicon between the first and second metal silicides in the NMOS and PMOS gate structures. Yet another aspect of the invention provides a transistor gate structure, comprising a gate dielectric formed above a semiconductor body, a first metal silicide above the gate dielectric, the first metal silicide being doped with n or p-type impurities, and a second metal silicide above the first metal silicide.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
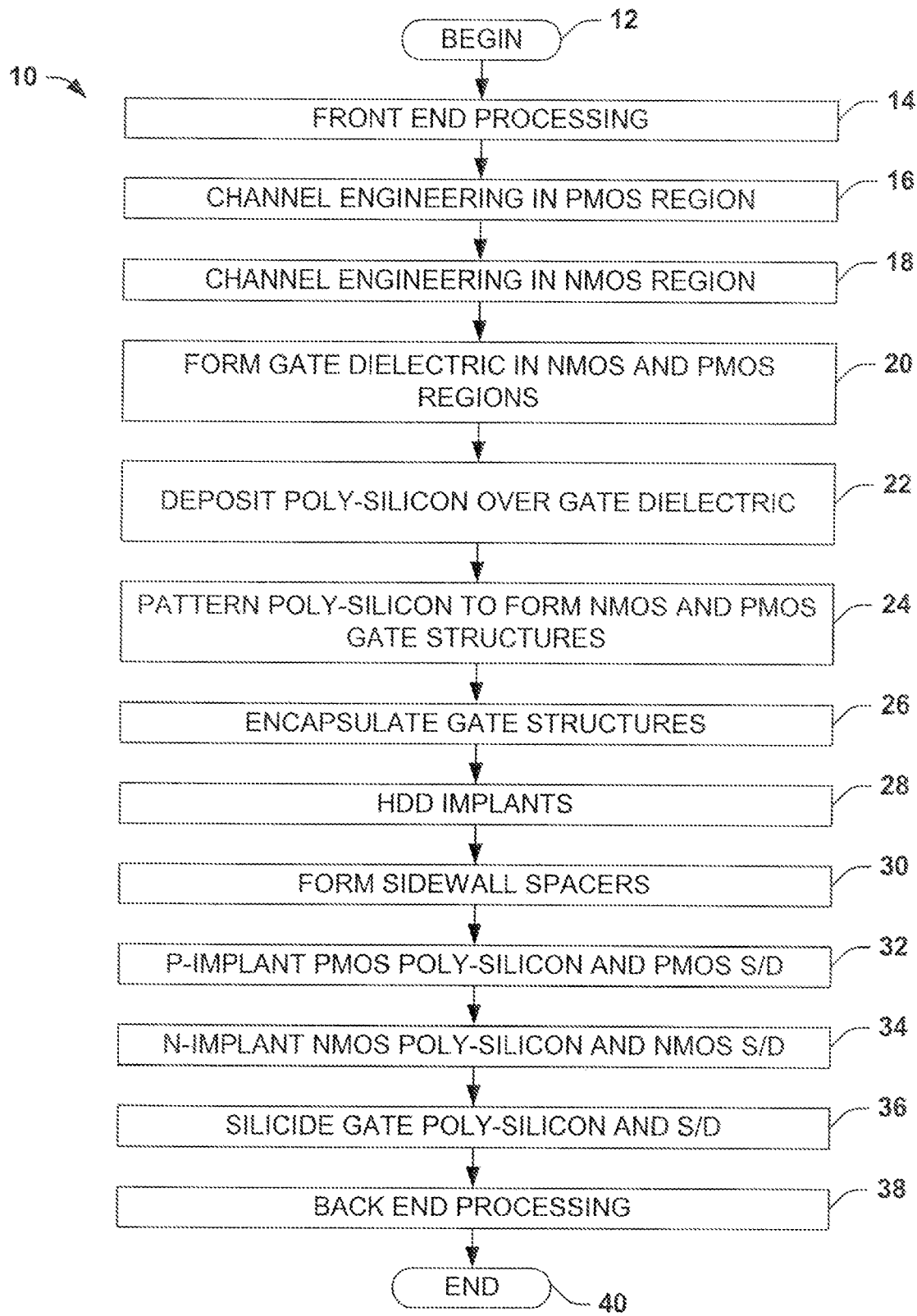
FIG. 1 is a simplified flow diagram illustrating a conventional poly-silicon gate CMOS fabrication process including channel engineering for both PMOS and NMOS transistors.

One or more implementations of the present invention will now be described with reference to the attached drawings, wherein like reference numerals are used to refer to like elements throughout, and wherein the illustrated structures are not necessarily drawn to scale. The invention relates to semiconductor devices, as well as MOS transistor gate structures and fabrication methods therefore, in which first and second metal silicides are formed in a gate structure and the first metal silicide is doped.

Figure 2A:
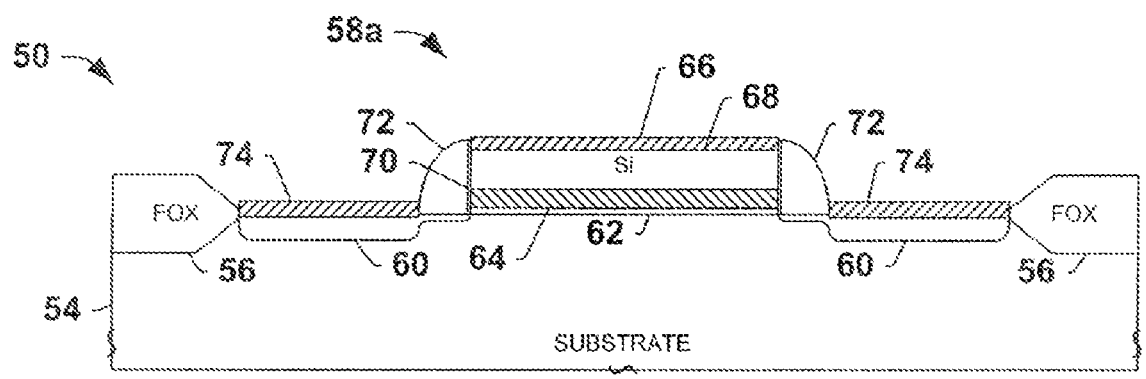
FIGS. 2A and 2B are partial side elevation views in section illustrating exemplary MOS transistors having gate structures with first and second metal silicides in accordance with one or more aspects of the present invention.
Figure 2B:
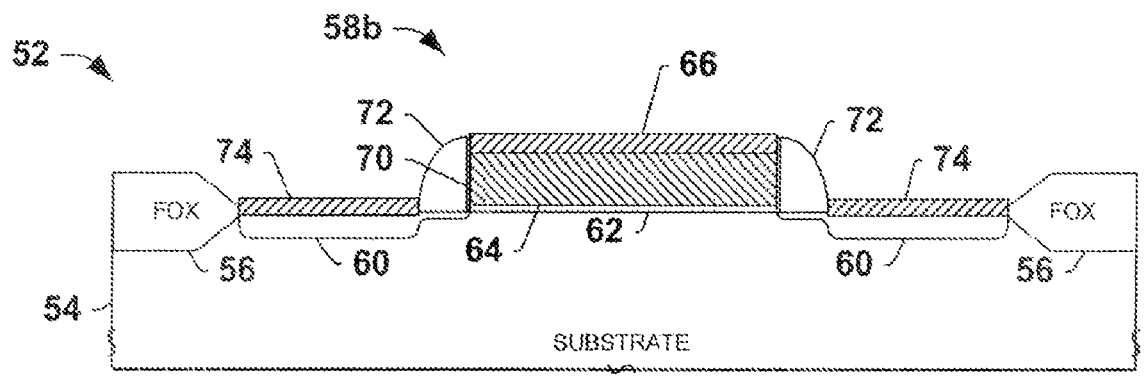

FIGS. 2A and 2B illustrate exemplary CMOS semiconductor devices 50 and 52, with NMOS transistors 58a and 58b, respectively, having gate structures in accordance with the invention. The devices 50, 52 are fabricated in or on a silicon substrate 54, although the invention may be carried out in association with SOI wafers, epitaxial silicon layers formed over silicon wafers, and any other semiconductor body. N-wells, p-wells, and/or buried layers (not shown) may be formed in the substrate 54, and the substrate 54 may be initially doped with p-type or other impurities. The transistors 58a and 58b include field oxide (FOX) isolation structures 56, and n-doped source/drains 60.

In accordance with an aspect of the invention, the devices 50 and 52 include MOS transistor gate structures, comprising a gate dielectric layer 62 formed above a channel region of the substrate 54, an n-doped first metal silicide 64 above the gate dielectric 62 having a thickness of about 100 Å or less, and a second metal silicide 66 above the first metal silicide 64, wherein the exemplary gate structures of FIGS. 2A and 2B have a total thickness on the order of about 1000 Å or less. The gate structures have sidewalls over which an encapsulation oxide or other material 70 is formed, and along which sidewall spacers 72 are formed. Silicide source/drain contacts 74 are formed over the source/drains 60. The transistor 58b in FIG. 2B provides a gate structure having a bilayer metal silicide with the second silicide 66 situated over the doped first silicide 64.

The transistor 58a of FIG. 2A further includes a silicon layer 68 between the first and second metal silicides 64 and 66. The intervening silicon 68 may be doped to increase the conductivity thereof, and to thereby reduce the sheet resistance of the gate, wherein a portion of the silicon 68 may be reacted with nickel or other metal in forming the second silicide 66. In this regard, a poly-silicon (not shown) may be deposited above the first silicide 64 in the device 52, the entirety of which is consumed in forming the second silicide 66, leaving the bilayer silicide gate stack shown in FIG. 2B. The provision of silicon above the first silicide 64 advantageously provides protection for the first silicide 64 in fabrication processing, for example, to integrate the creation of the gate structures of the invention into existing CMOS process flows tailored for poly-silicon being present during gate etch processes to define the gate structures for NMOS and PMOS transistors. For instance, poly-silicon coverage may be desirable for a case in which the first silicide 64 comprises titanium silicide, which is reactive to hydrogen fluoride used in wet etch steps or other processing following formation of the first silicide 64.

In the illustrated devices 50 and 52, the first and second metal silicides 64 and 66, respectively, are different, wherein the first metal silicide 64 comprises a refractory metal such as molybdenum, tungsten, tantalum, titanium, or others, while the second metal silicide comprises nickel. Alternatively, the first and second metal silicides 64 and 66 can be the same type and/or can comprise any suitable metal within the scope of the invention. However, the inventors have appreciated that the use of refractory metal silicides, such as $MoSi_2$ or others comprising W, Ti, Ta, etc., for the first silicide 64 provides high melting temperatures to withstand fabrication processing. In this regard, nickel or other second silicides 66 provide low resistivity, wherein the second silicide 66 may be formed later in a fabrication flow, and thus only be exposed to relatively lower temperature back-end processing.

While NMOS transistors 58 are illustrated in FIGS. 2A and 2B, the aspects of the invention are also applicable to PMOS structures, as described further below with respect to FIGS. 5A-5O and 7A-7O. The dopants in the first metal silicide 64 of NMOS and PMOS transistor gate structures can be separately tailored for setting the respective gate work functions, thereby facilitating threshold voltage tuning while simplifying or eliminating channel engineering steps and avoiding poly depletion troubles of conventional CMOS devices. A single type of doped metal silicide can be employed in both the NMOS and PMOS regions of a device, thus simplifying subsequent patterning and other processing steps. N and p-type dopants are separately introduced into the lower metal silicide 64 to provide differentiated work functions for NMOS and PMOS transistors, respectively, either before or after gate patterning.

Another aspect of the invention provides methods for fabricating PMOS and NMOS transistors in a semiconductor device. In the examples below, an n-doped first metal silicide is formed above a gate dielectric in an NMOS region of a semiconductor device, a p-doped first metal silicide is formed above the gate dielectric in a PMOS region, and a second metal silicide is formed above the doped first metal silicide in the NMOS and PMOS regions. In accordance with the invention, the n-doped and p-doped first silicides can be formed by separate processes for the NMOS and PMOS regions, respectively. However, the invention also advantageously provides for forming the doped first silicides using a common starting material in both NMOS and PMOS regions. In one example, a single starting first metal silicide is deposited above the gate dielectric and then selectively doped in the NMOS and PMOS regions. In another implementation, a common first metal and a first silicon are deposited in both regions, and are subsequently annealed to form the first silicide, either before, or after selective doping of the NMOS and PMOS regions. Thereafter, a second or upper silicide, doped or undoped, is formed above the first silicide, and an optional silicon layer may be formed between the first and second silicides.

Figure 3:
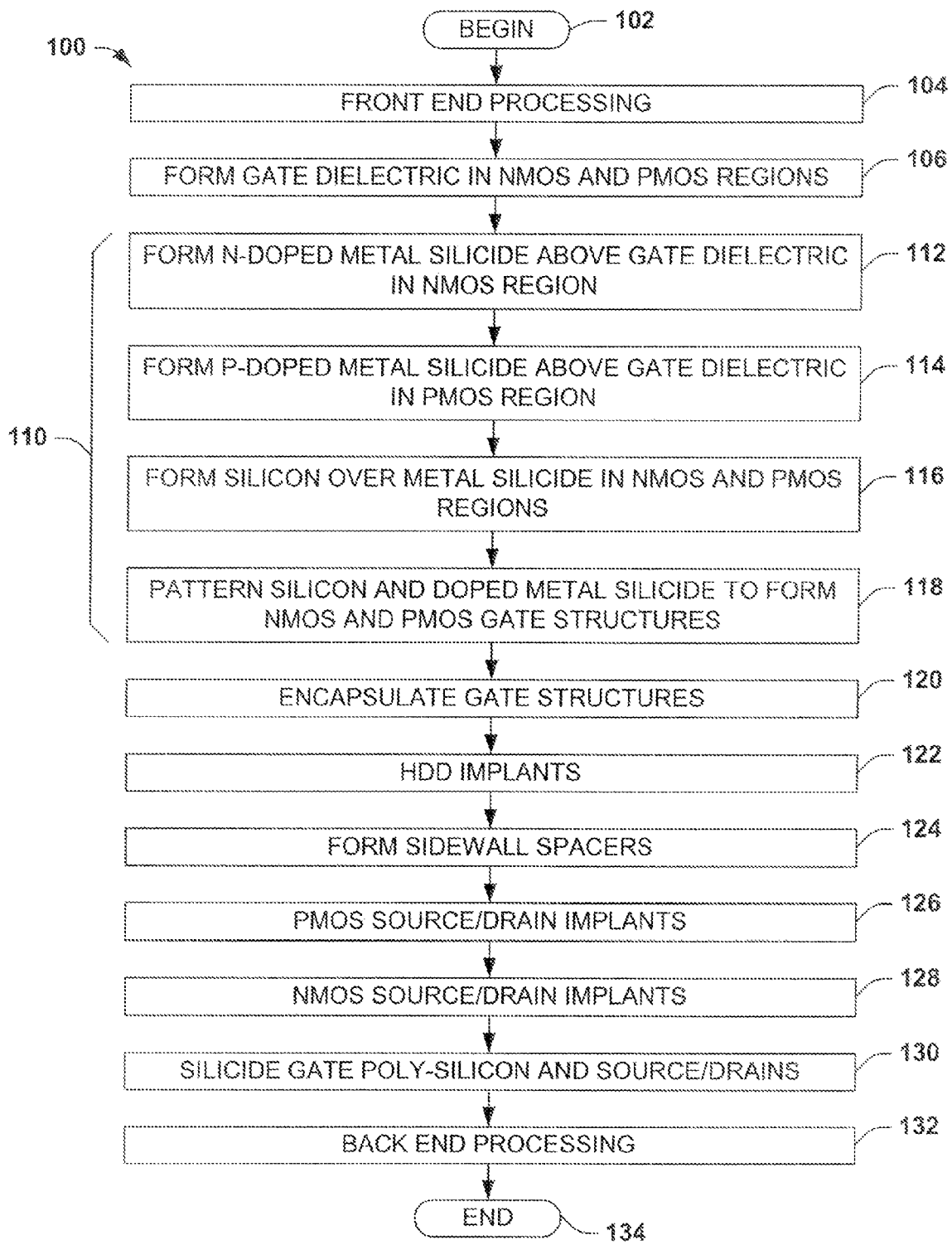
FIG. 3 is a flow diagram illustrating an exemplary method of fabricating semiconductor devices having PMOS and NMOS gate structures in accordance with the invention.
Figure 4:
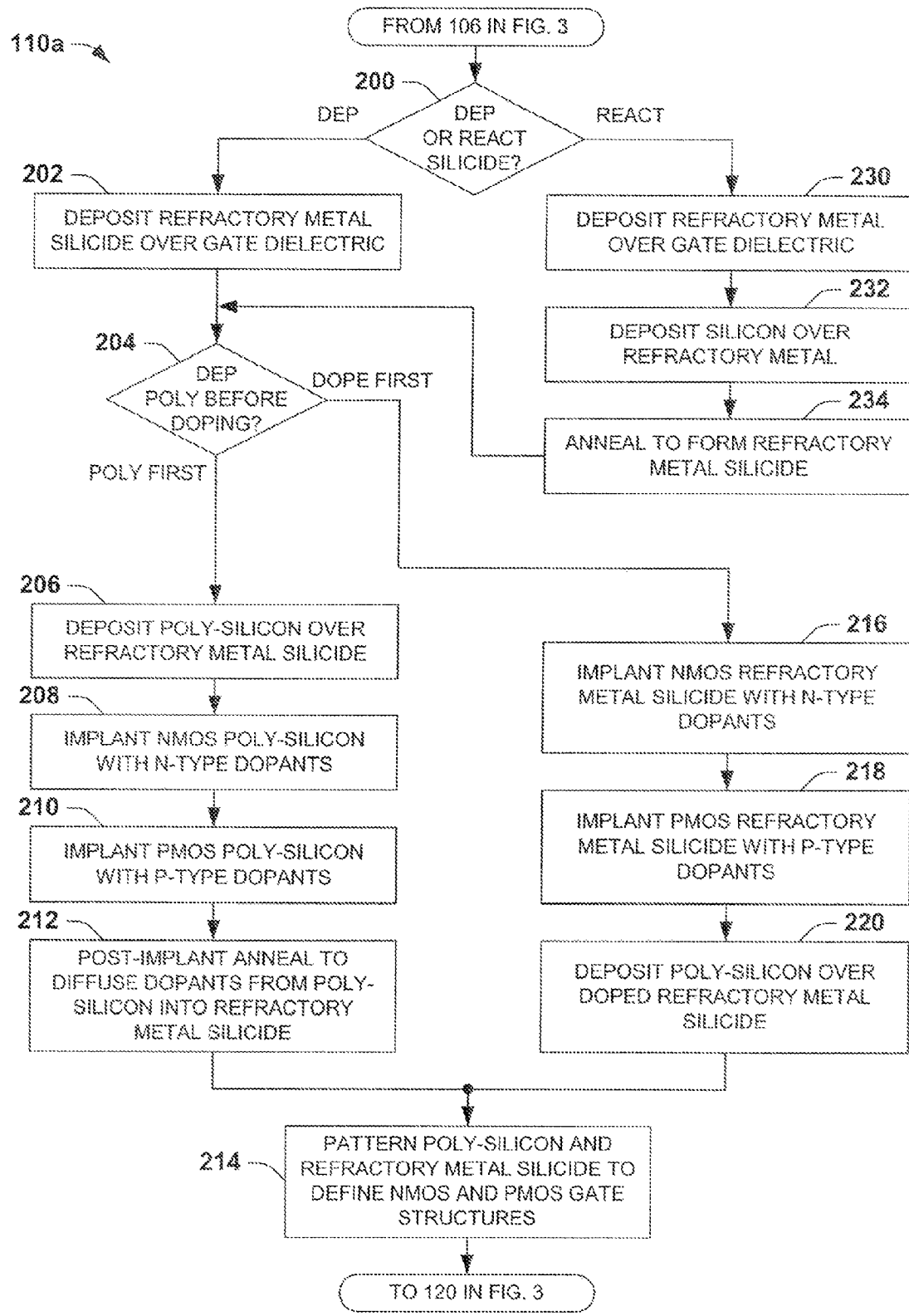
FIG. 4 is a partial flow diagram illustrating several techniques for forming MOS transistor gate structures with doped first metal silicide in the fabrication method of FIG. 3, wherein the first metal silicide is formed through deposition or reaction prior to introducing dopants therein.
Figures 5A, 5B, 5C:
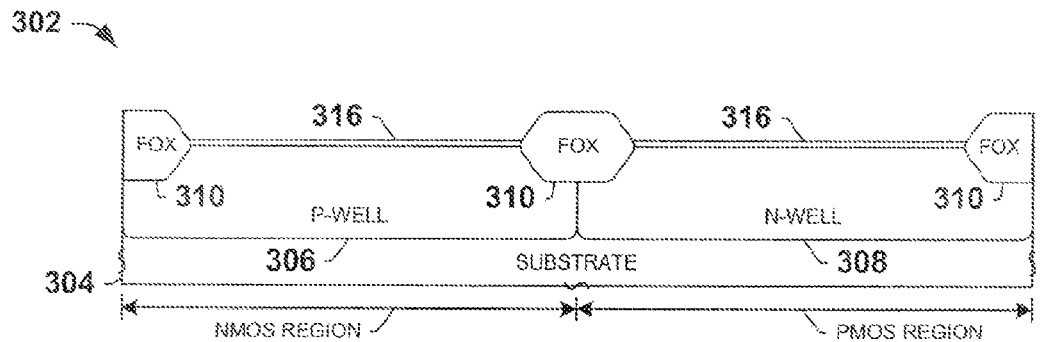
FIGS. 5A-5L are partial side elevation views in section illustrating exemplary NMOS and PMOS transistors undergoing CMOS processing in accordance with the invention at various stages of fabrication to form gate structures with first and second metal silicides and an intervening poly-silicon.
Figure 5D:
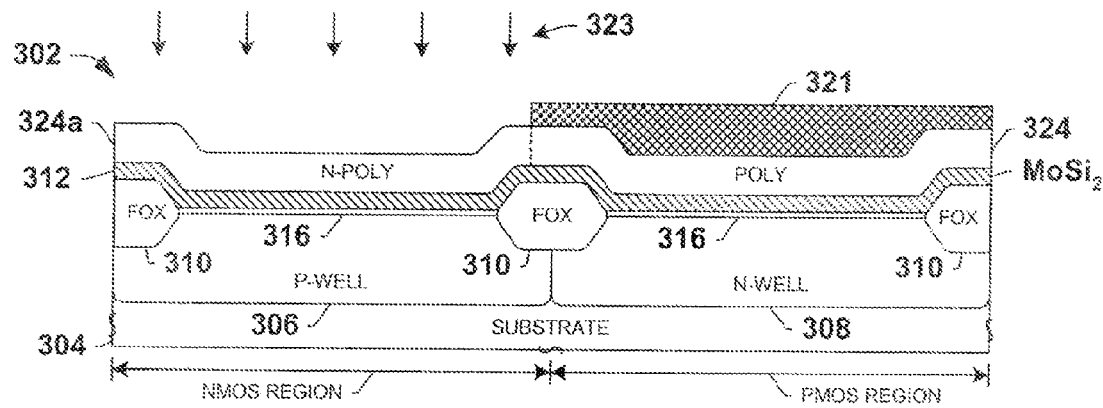
Figure 5O:
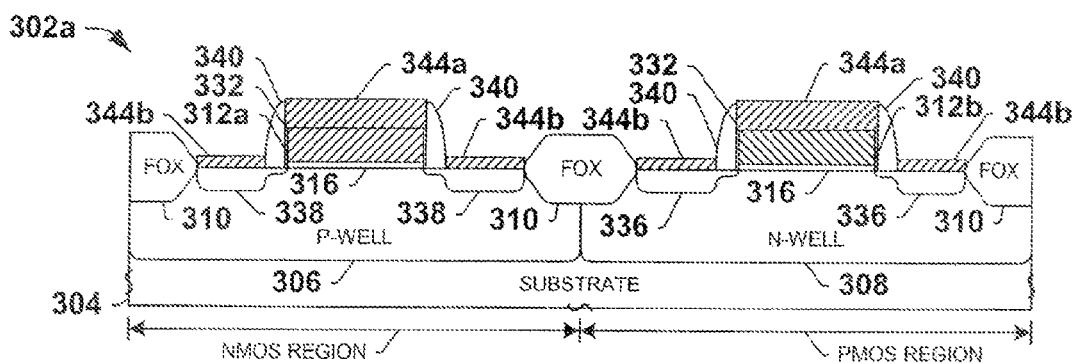
Figure 6:
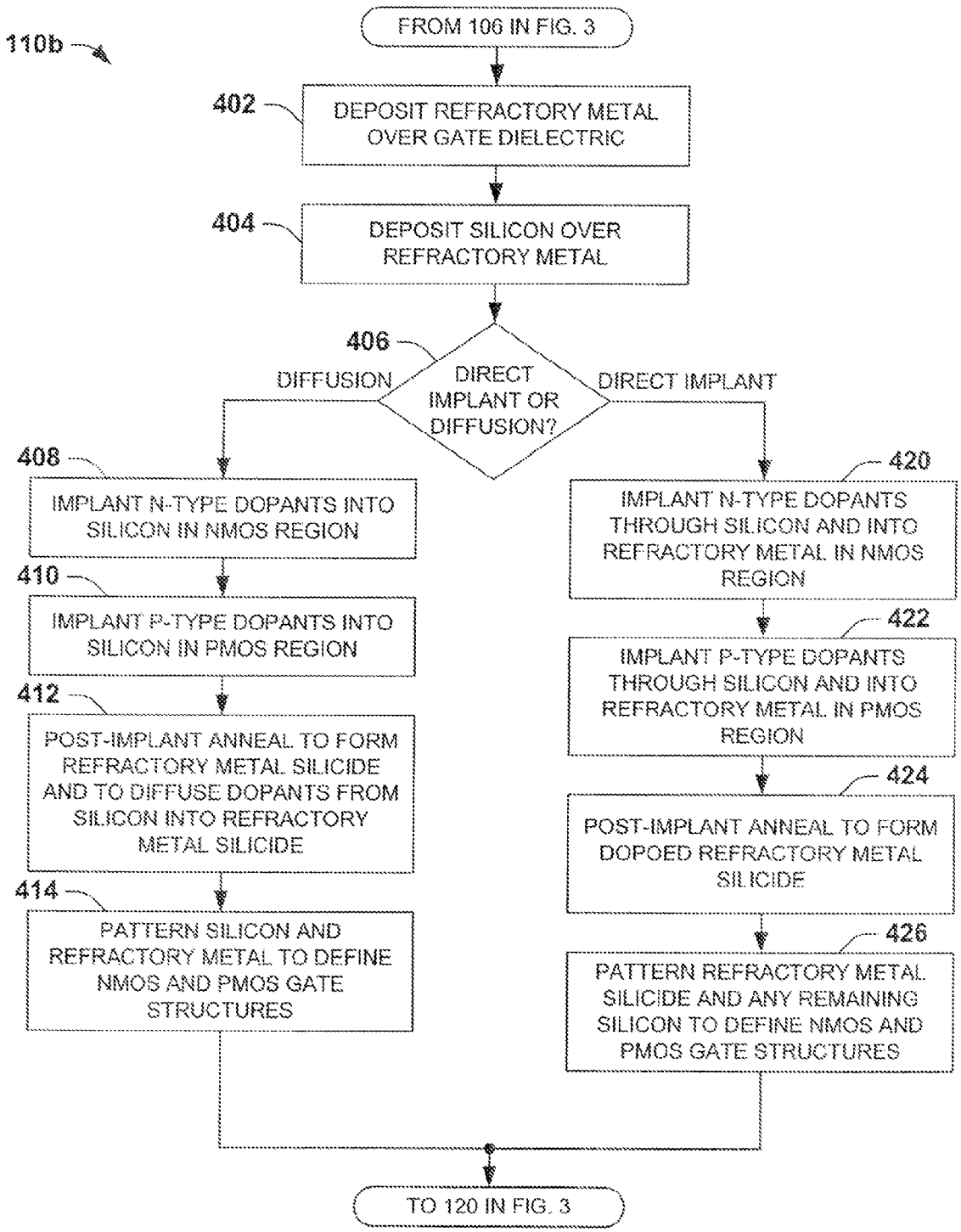
FIG. 6 is a partial flow diagram illustrating other techniques for forming MOS transistor gate structures with doped first metal silicide in the fabrication method of FIG. 3, in which one or both of a first metal and a first silicon are doped prior to annealing to form the first metal silicide.
Figure 7A:
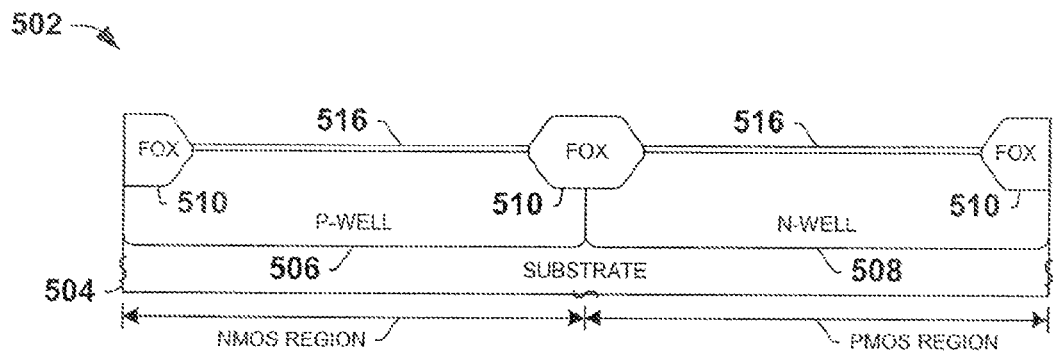
FIGS. 7A-7L are partial side elevation views in section illustrating exemplary NMOS and PMOS transistors undergoing processing at various stages of fabrication to form gate structures with first and second metal silicides and an intervening silicon in accordance with the invention.

FIG. 3 illustrates an exemplary semiconductor device fabrication process 100 in accordance with the invention, and FIG. 4 illustrates various exemplary techniques for forming MOS transistor gate structures with doped first metal silicide in the fabrication method of FIG. 3, in which the first metal silicide is formed through deposition or reaction prior to introducing dopants therein. FIGS. 5A-5O illustrate fabrication of an exemplary CMOS device according to the processing examples of FIGS. 3 and 4. FIG. 6 illustrates other techniques for forming MOS transistor gate structures with doped first metal silicide in the fabrication method of FIG. 3, in which one or both of a first metal and a first silicon are doped prior to annealing to form the first metal silicide. FIGS. 7A-7O illustrate fabrication of an exemplary CMOS device according to the processing examples of FIGS. 3 and 6.

Although the exemplary method 100 of FIGS. 3, 4, and 6 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Further, the methods according to the present invention may be implemented in association with the formation and/or processing of structures illustrated and described herein as well as in association with other structures and devices not illustrated.

The method 100 begins at 102 in FIG. 3, wherein front end processing is performed at 104. Any front end processing may be performed within the scope of the invention, wherein the processing at 104 may include, for example, formation of n and p wells using diffusion, implantation, or other suitable processing steps, as well as formation of isolation structures in field regions of a device wafer, using LOCOS, STI, or any suitable isolation processing. The front-end processing 104 may also comprise channel doping (e.g., channel engineering) to adjust the work function of a channel portion of the semiconductor body in prospective NMOS and/or PMOS active regions. Such channel engineering may include, for example, a shallow Vt adjust implant to introduce boron or other p-type dopants into the NMOS channel regions with the PMOS regions masked to raise the NMOS channel work function. In addition, a boron punch-thru implant may be performed to suppress punch-through, along with a somewhat deeper boron channel stop implant in the NMOS regions. Similar channel engineering may be performed to provide n-type dopants (e.g., arsenic, phosphorus, etc.) to the PMOS regions with the NMOS regions masked.

At 106, a gate dielectric is formed in the NMOS and PMOS regions using any suitable materials, material thicknesses, and processing steps, including a single thermal oxidation or deposition or combinations thereof to form a gate dielectric above the semiconductor body. The invention may be employed in conjunction with any gate dielectric material, such as $SiO_2$, SiON, high-k dielectrics, and stacks or combinations thereof, including but not limited to binary metal oxides including aluminum oxide ($Al_2O_3$), zirconium oxide ($ZrO_2$), hafnium oxide ($HfO_2$), lanthanum oxide ($La_2O_3$), yttrium oxide ($Y_2O_3$), titanium oxide ($TiO_2$), as well as their silicates and aluminates; metal oxynitrides including aluminum oxynitride (AlON), zirconium oxynitride (ZrON), hafnium oxynitride (HfON), lanthanum oxynitride (LaON), yttrium oxynitride (YON), as well as their silicates and aluminates such as ZrSiON, HfSiON, LaSiON, YSiON, etc.; and perovskite-type oxides including a titanate system material such as barium titanate, strontium titanate, barium strontium titanate (BST), lead titanate, lead zirconate titanate, lead lanthanum zirconate titanate, barium lanthanum titanate, barium zirconium titanate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, barium titanium niobate; and bilayered perovskite system material such as strontium bismuth tantalate, bismuth titanate and others. Separate processing may optionally be employed to form different gate dielectrics in the NMOS and PMOS regions within the scope of the invention. In the examples illustrated and described herein, a single thermal oxidation is performed at 106 to create a thin $SiO_2$ or gate oxide overlying the substrate in the NMOS and PMOS regions.

Gate structures are then formed at 110, with the general gate fabrication principles being illustrated in FIG. 3, and several exemplary gate fabrication implementations being illustrated in FIGS. 4 and 6. An n-doped first metal silicide is formed above the gate dielectric in the NMOS region at 112 in FIG. 3, and a p-doped first metal silicide is formed above the gate dielectric in the PMOS region at 114. The first silicide may be formed by any suitable techniques in accordance with the invention, including but not limited to deposition of a metal silicide, or formation of metal and silicon layers and reaction thereof to form the first metal silicide. N-type and p-type dopants are selectively introduced into the first metal silicide of the NMOS and PMOS regions using any suitable techniques, including but not limited to implantation and/or diffusion, wherein the dopants may be introduced before and/or after silicidation of a first metal with silicon in the case of reacted silicide.

A silicon layer is formed at 116 above the first metal silicide in the NMOS and PMOS regions, some or all of which may subsequently be consumed in forming a second metal silicide above the first metal silicide, wherein the silicon may, but need not, be n-doped or p-doped in the NMOS and PMOS regions, respectively. Any suitable formation techniques may be employed to create the silicon at 116, for example, chemical vapor deposition (CVD) processes, etc. The silicon may be formed at 116 directly over the first metal silicide or may be formed over one or more intervening material layers within the scope of the invention. The silicon and first metal silicide are patterned at 118 to form NMOS and PMOS gate structures using any suitable techniques, for example, such as masked etching.

At 120, the gate structures are optionally encapsulated using any suitable materials and processing steps. Highly-doped drain (HDD) implants are performed at 122 to introduce p-type dopants (e.g., boron, etc.) into prospective PMOS source/drains and to provide n-type dopants (e.g., arsenic, phosphorus, etc.) to prospective NMOS source/drains, using any suitable processing steps and operational parameters, wherein the patterned gate structures and isolation structures operate as implantation masks. The HDD implants at 122 also provide n-type dopants to the silicon in the NMOS regions and p-type dopants to the silicon in the PMOS regions in the illustrated example, although the gate silicon layers can alternatively be masked during the implantation operations at 122. Sidewall spacers are formed at 124 along the lateral sidewalls of the patterned gate structures, using any suitable process techniques and materials, for example, by depositing and etching $SiO_2$, $Si_3N_4$, etc.

Source/drain implants are then performed at 126 and 128 to further dope the PMOS and NMOS source/drain regions of the semiconductor body, wherein n-type dopants may also be implanted into the silicon in the NMOS regions and p-type dopants may be implanted into the silicon in the PMOS regions. In the illustrated implementation, a PMOS source/drain implant is performed at 126, to introduce boron or other p-type impurities into the PMOS region of the semiconductor body and into the PMOS gate silicon with the NMOS region masked. Any suitable implantation technique, operational settings, and implant species may be employed at 126 to render the PMOS gate silicon conductive and to further define the PMOS source/drains in the semiconductor body.

An NMOS source/drain implant is performed at 128 to introduce arsenic, phosphorus, or other suitable n-type impurities to the NMOS region of the semiconductor body and to the NMOS gate silicon with the PMOS region masked. Any suitable implantation technique, operational settings, and implant species may be employed at 128 to render the NMOS gate silicon conductive and to further define the NMOS source/drains, wherein the implants at 126 and 128 may be performed in any order. In addition, activation anneal operations may be performed following one or both of the source/drain implants 126, 128, wherein such annealing may also operate to diffuse dopants in the first silicide.

A self-aligned silicide process is performed at 130 to silicide the source/drains and the gate silicon, wherein silicidation of the gate silicon creates a second metal silicide above the first metal silicide of the gate stacks in the exemplary implementation. In one example, nickel or other metal is deposited at 130 over the gate silicon and over the semiconductor body in the prospective source/drain regions, and the wafer is annealed to react the gate silicon and the source/drain region silicon of the semiconductor body with the deposited nickel to form nickel silicide. By this technique, the second silicide of the gate stack may be formed above the doped first metal silicide concurrently with formation of source/drain silicide contacts, although separate silicide formation techniques (e.g., reaction or deposition and etching) may be employed to form the second metal silicide of the gate structures. In one implementation (e.g., FIG. 2A above), a portion of the doped silicon remains unreacted after the silicidation at 130. In another example, substantially all of the silicon is consumed at 130 in creating the second silicide, leaving a silicide bilayer gate structure as shown in FIG. 2B above.

The second silicide can be formed anywhere above the first metal silicide of the gate structure within the scope of the invention. For example, the second silicide may be formed directly over the first metal silicide, directly over an intervening silicon, or one or more other layers may be situated between the second silicide and the first silicide or the silicon. As discussed above, the second silicide may be the same or may comprise different metal than the first silicide. For example, the second silicide may advantageously comprise nickel (e.g., low resistivity, lower melting temperature), where the first metal silicide comprises a refractory metal (e.g., molybdenum, tungsten, tantalum, titanium, etc.) having a higher melting temperature. In this manner, the second silicide may provide improved (e.g., lower) gate sheet resistance, whereas the first silicide is able to withstand relatively higher processing thermal budget between the first silicide formation at 112 and the back-end processing at 132. In addition, the provision of the intervening silicon over the first metal silicide (e.g., whether fully consumed at 130 or not) may advantageously protect the first metal silicide during fabrication processing. Back end processing (e.g., interconnect metalization, etc.) is performed at 132, before the exemplary method 100 ends at 134.

Referring now to FIGS. 3, 4, and 5A-5O, an exemplary CMOS device 302 is illustrated in FIGS. 5A-5O at various stages of fabrication processing generally according to the method 100 above. In this example, the gate fabrication for the NMOS and PMOS transistors (e.g., 110 in method 100) is illustrated in further detail in FIG. 4, in which a first metal silicide (e.g., $MoSi_2$ 312 in the exemplary device 302) is formed through deposition or reaction prior to introduction of n or p-type dopants therein. FIGS. 5A-5L illustrate exemplary NMOS and PMOS transistors in the device 302 undergoing processing at various stages of fabrication in accordance with the invention to form gate structures with first and second metal silicides 312 and 344 and an intervening poly-silicon 324. In FIGS. 5M-5O, an alternate device 302a is illustrated having gate structures with first and second metal silicides in a silicide bilayer with no intervening silicon in accordance with the invention.

As illustrated in FIG. 5A, the CMOS device 302 includes a silicon substrate semiconductor body 304 with a p-well 306 formed in an NMOS region and an n-well 308 formed in a PMOS region, as well as field oxide (FOX) isolation structures 310, where the wells 306, 308 and the field oxide 310 are formed during front-end processing (e.g., at 104 in FIG. 3). A gate dielectric 316 is then formed (e.g., at 106 in FIG. 3) over the surface of the substrate 304 in NMOS and PMOS active regions of the device 302 between the FOX isolation structures 310, for example, a thermally grown $SiO_2$ oxide 316 or any other dielectric material formed by any suitable technique in the illustrated device 302. FIG. 4 illustrates various alternative gate structure fabrication approaches wherein a first metal silicide is formed over the gate dielectric 316 through deposition or silicide reaction of metal and silicon (e.g., "DEP" or "REACT" at 200), and wherein poly-silicon is formed above the first metal silicide either before or after doping (e.g., "POLY FIRST" or "DOPE FIRST" at 204).

In the exemplary device 302, the first metal silicide 312 is formed through deposition (e.g., "DEP" at 200). In FIG. 5B, a refractory metal silicide 312 (molybdenum disilicide, $MoSi_2$) is deposited (e.g., 202 of FIG. 4) over the gate dielectric 316 in NMOS and PMOS regions of the device 302 via a deposition process 314, for example, sputtering, CVD, ALD, or other suitable deposition technique. The first metal silicide 312 may be deposited or otherwise formed to any suitable thickness within the scope of the invention, wherein the silicide 312 in the exemplary device 302 has a thickness of about 100 Å or less. Compared with reacting the first metal silicide (e.g., 230-234 below), deposition of the first metal silicide 312 through sputtering, CVD, etc., may allow tighter control over the final silicide composition.

A layer of silicon 324 is then deposited in FIG. 5C over the first metal silicide 312 before doping (e.g., "POLY FIRST" at 204) using a CVD deposition process 326 (206 in FIG. 4). The silicon 324 may be formed to any desired thickness within the scope of the invention. Alternatively, dopants may be directly implanted into the first metal silicide prior to silicon deposition (e.g., 216-220 below). In FIG. 5D, a mask 321 is formed to cover the PMOS regions and expose the NMOS regions, and n-type dopants (e.g., P, As, etc.) are introduced via an implantation process 323 into the exposed silicon in the NMOS regions, thus creating n-doped poly-silicon 324a over the first metal silicide in the NMOS regions (208 in FIG. 4). The range of the implantation can also be adjusted to dope the poly-silicon near to the metal silicide, or to dope the silicide layer itself.

Figure 5E:
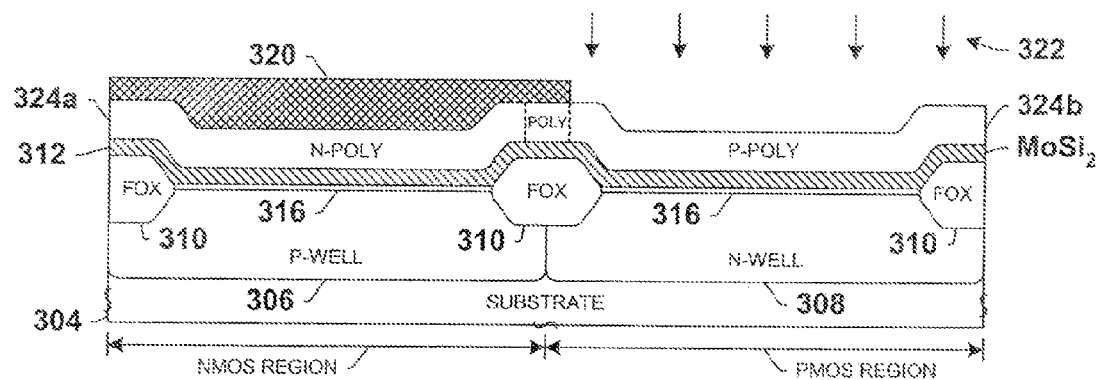
Figure 5F:
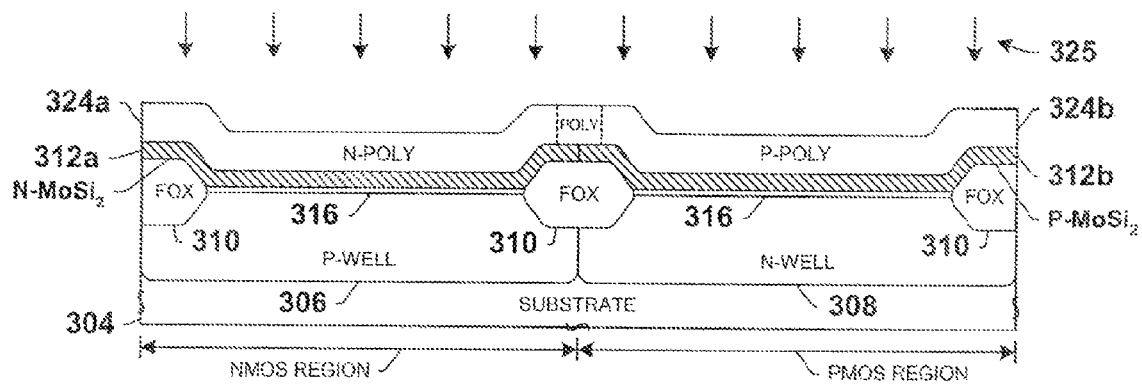

The mask 321 is then removed and a mask 320 is formed in FIG. 5E to cover the NMOS regions and expose the PMOS regions. An implantation process 322 is performed to provide boron or other p-type dopants to the poly-silicon in the PMOS region (210 in FIG. 4), thereby creating p-doped poly-silicon 324b over the first silicide 312 in the PMOS region, after which the mask 320 is removed. Alternatively, the first silicide 312 and the poly-silicon 324 can be patterned before the implantations at 208 and 210. Thereafter in FIG. 5F, an anneal process 325 is performed (212 in FIG. 4) to diffuse n and p-type dopants from the NMOS and PMOS poly-silicon 324a and 324b, respectively, into the underlying first metal silicide 312 in the NMOS and PMOS regions, thereby creating n and p-doped first metal silicide 312a and 312b in the NMOS and PMOS regions, respectively.

Figure 5G:
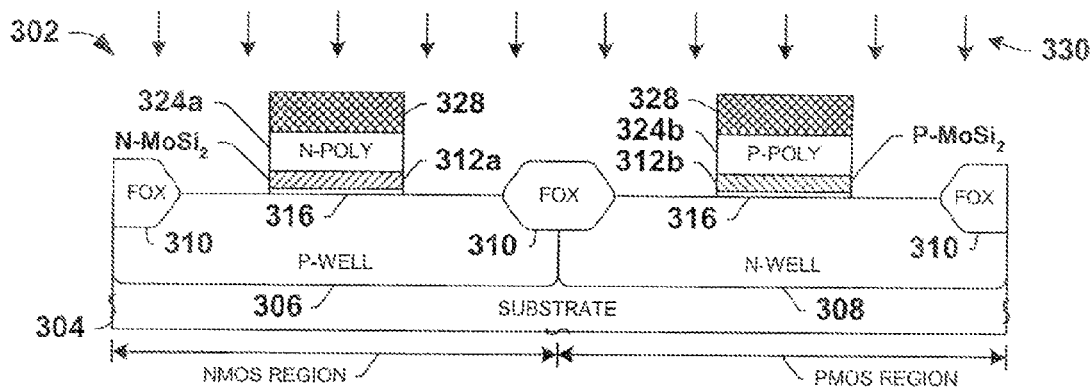
Figure 5H:
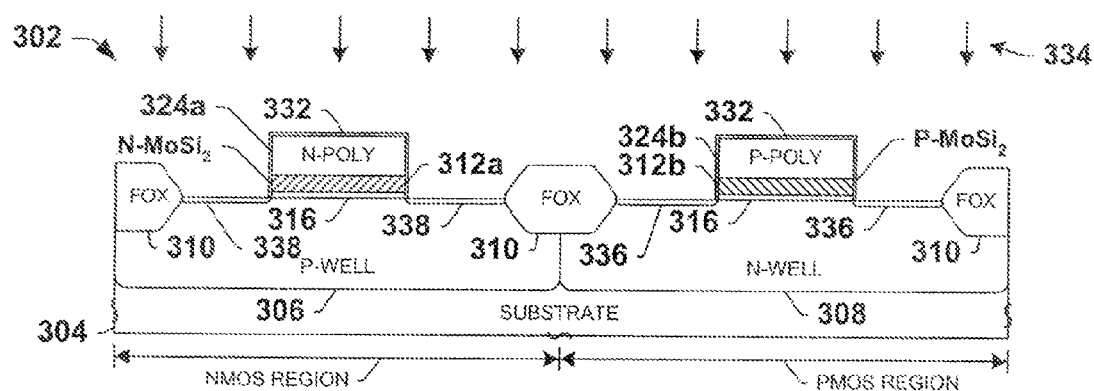

In FIG. 5G, a mask 328 is formed, and the n and p-doped poly-silicon 324a and 324b, respectively, as well as the doped first metal silicide are patterned (214 in FIG. 4) via an etch process 330 to define patterned NMOS and PMOS gate structures. In FIG. 5H, the mask 328 is removed and the patterned gate structures are encapsulated (120 In FIG. 3) by forming a single or multi-layer encapsulation structure 332 along the sidewalls and top of the gate structures. Following encapsulation, HDD implants 334 are performed (122 in FIG. 3) to introduce p-type dopants into prospective PMOS source/drains 336 and to introduce n-type dopants into prospective NMOS source/drains 338, with the field oxide 310 and patterned gate structures operating as an implantation mask.

Figure 5I:
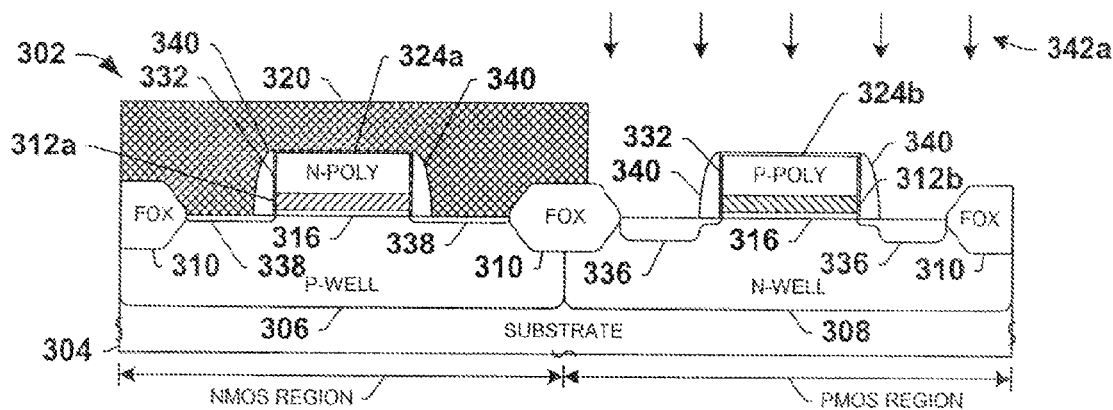
Figure 5J:
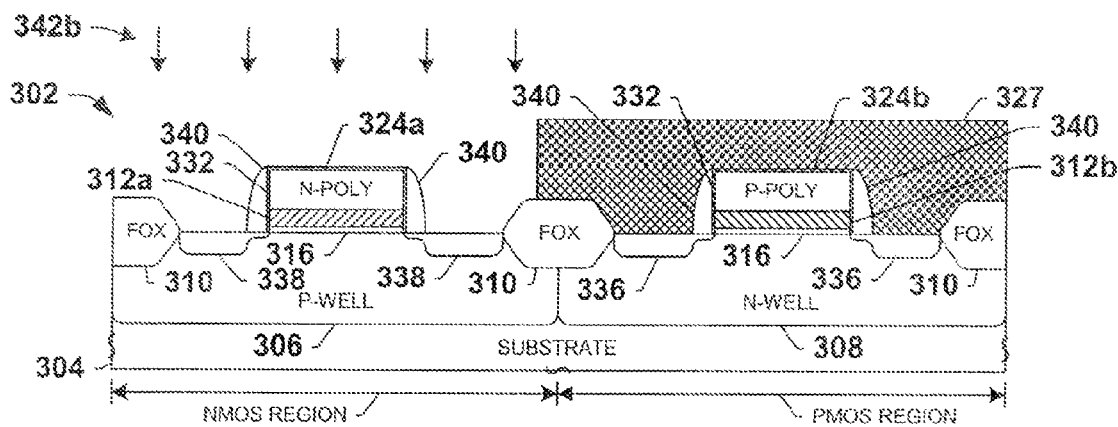

In FIG. 5I sidewall spacers 340 are formed (e.g., 124 in FIG. 3) along the lateral sidewalls of the patterned gate structures. A mask 320 is formed over the NMOS region, and a p-type source/drain implant 342a is performed (126 in FIG. 3) to implant boron or other p-type impurities into the PMOS region, which further defines the PMOS source/drains 336 and provides additional dopants to the PMOS gate stack poly-silicon 324b. The mask 320 is removed in FIG. 5J, and a mask 327 is formed over the PMOS region. An n-type source/drain implant 342b is performed (128 in FIG. 3) to implant arsenic, phosphorus or other n-type impurities into the NMOS region, thus further defining the NMOS source/drains 338 and providing additional dopants to the NMOS gate stack poly-silicon 324a.

Figure 5K:
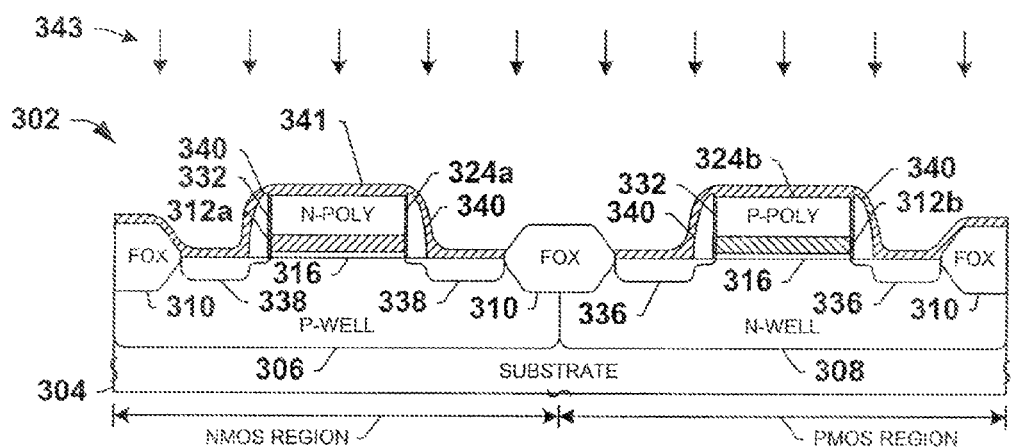
Figure 5L:
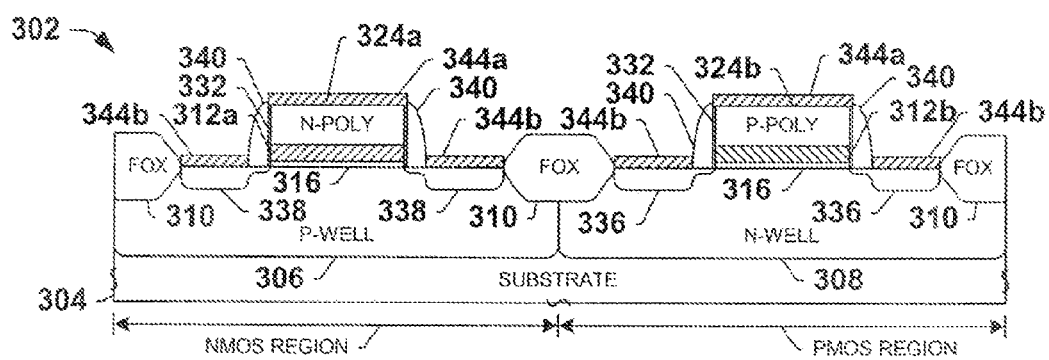
Figure 5M:
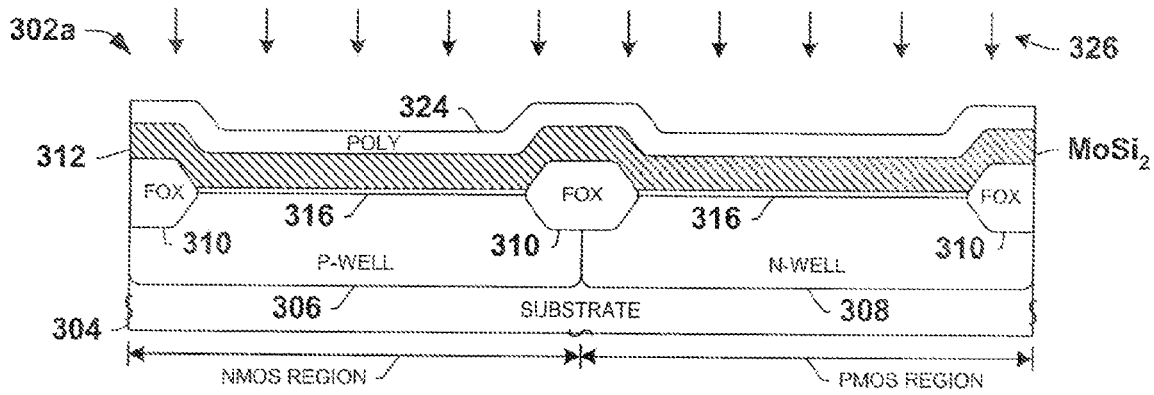
FIGS. 5M-5O are partial side elevation views in section illustrating exemplary NMOS and PMOS transistors undergoing CMOS processing at various stages of fabrication to form gate structures with first and second metal silicides in a silicide bilayer with no intervening silicon in accordance with the invention.
Figure 5N:
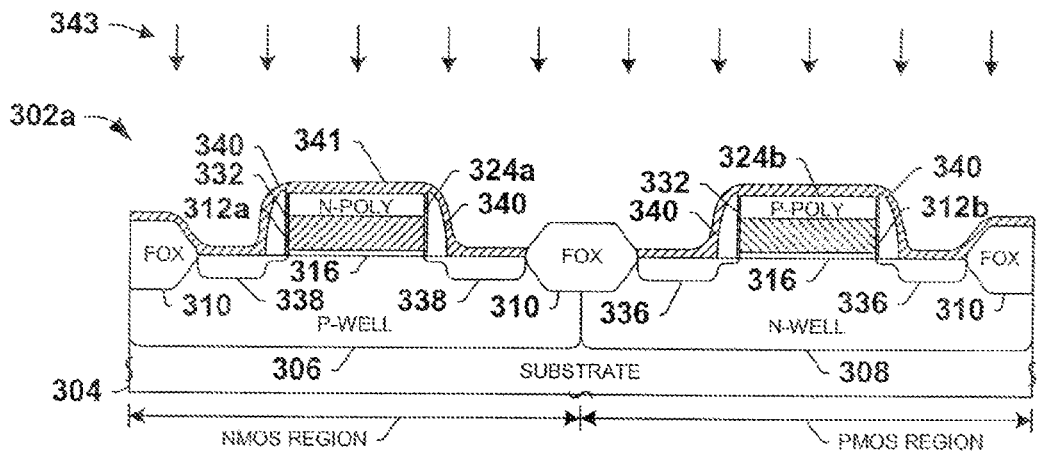

In FIGS. 5K and 5L, a second metal silicide 344a is formed (130 in FIG. 3) above the first metal silicide 312 and the poly-silicon 324, and source/drain silicide contacts 344b are formed over the source drains 336 and 338. In the illustrated example, a layer of nickel 341 is deposited over the device 302 in FIG. 5K, whereby the nickel 341 overlies the poly-silicon 324 of the patterned gate stacks and also overlies the doped source/drains 336 and 338 of the substrate 304. A thermal anneal 343 is performed to react the nickel 341 with the poly-silicon 324 of the gate stacks, thereby forming a second metal silicide 344a above the remaining poly-silicon 324 as seen in FIG. 5L. In addition, the anneal 343 concurrently reacts the nickel 341 with the source/drain silicon 336 and 338 to form nickel silicide source/drain contacts 344b, after which any remaining (e.g., unreacted) nickel 341 is removed. Interconnect metalization and other back-end processing (not shown) may thereafter be performed to complete the fabrication of the device 302 (132 in FIG. 3). The second metal silicide 344a and the source/drain silicide contacts 344b may alternatively be formed by separate processes within the scope of the invention.

FIGS. 5M-5O illustrate an alternative device 302a in accordance with the invention, having MOS gate structures comprising first and second metal silicides 312 and 344a in a silicide bilayer with no intervening poly-silicon. In FIG. 5M, a relatively thick first metal silicide 312 is formed over the gate dielectric 316 (e.g., $MoSi_2$ having a thickness greater than about 100 Å) and somewhat thinner poly-silicon 324 is deposited over the first metal silicide 312. Following gate stack and source/drain fabrication as described above, FIG. 5N illustrates deposition of nickel 341 over the patterned NMOS and PMOS gate structures and the source/drains 336, 338. An anneal process 343 is performed to react the nickel 341 with the poly-silicon 324 of the gate stacks, thereby forming a second metal silicide 344a and concurrently forming silicide source/drain contacts 344b. In the device 302a, the relative deposited thicknesses of the first silicide 312, the poly-silicon 324, and the nickel 341 are selected such that the anneal causes the silicide 344a to consume substantially all of the poly-silicon 324 in the gate structures, as seen in FIG. 5O.

Thus, a bilayer (e.g., first and second silicides 312 and 344a) is provided in the gates above the gate dielectric 316. As with the above example, a single silicide process may be used to concurrently form the second metal silicide 344a of the gate structures as well as the source/drain contacts 344b, or these may be formed by separate processes within the scope of the invention.

In the above example of FIGS. 4 and 5A-5O, the doped first metal silicide 312 is formed by depositing first metal silicide material 312 above the gate dielectric in the NMOS and PMOS regions, introducing n-type dopants into the first metal silicide material 312 in the NMOS region, and introducing p-type dopants into the first metal silicide material 312 in the PMOS region. However, alternative implementations are possible where the first (e.g., lower) metal silicide 312 is formed prior to introduction of dopants therein, some of which are illustrated in FIG. 4. In one alternative, the first metal silicide 312 may be formed by reaction of deposited silicon and metal (e.g., "REACT" at 200). In this case, a metal (e.g., refractory or other suitable first metal material) is deposited over the gate dielectric at 230 to any thickness using any suitable process. A first silicon is then deposited at 232 over the deposited metal, and an anneal is performed at 234 to form the first metal silicide 312.

This reacted silicide can then be provided with dopants through diffusion from an overlying doped poly-silicon (e.g., at 206-212 as described above), or be directly implanted prior to poly-silicon formation. In this case ("DOPE FIRST" at 204), the first metal silicide of the NMOS region is implanted at 216 with n-type dopants and the first metal silicide of the PMOS region is implanted with p-type dopants at 218, using appropriate masks. Thereafter an anneal may optionally be performed to diffuse the implanted dopants, and poly-silicon is deposited over the doped first metal silicide at 220. As one alternative, the silicon deposition at 220 (e.g., CVD deposition) may provide suitable thermal heating to diffuse the dopants to the desired depth, concentration, profile, etc. within the first metal silicide, whereby an extra (e.g., dedicated) anneal may not be required. Thereafter, the gate structures are patterned at 214 as described above. In the various implementations illustrated and described herein, the gate structures can alternatively be patterned at other points in the fabrication process, for example, prior to implantation and/or diffusion of dopants into the first metal silicide. Other possible alternatives include forming poly-silicon over undoped first metal silicide (reacted or deposited), and implanting dopants through the poly-silicon and into the underlying first metal silicide, with or without subsequent diffusion annealing.

Referring now to FIGS. 3, 6, and 7A-7O, another possible implementation involves doping one or both of a first metal and a first silicon prior to annealing to form the first metal silicide. This approach may advantageously facilitate location of dopants at a desired concentration at the bottom of the first metal silicide near the interface with the gate dielectric. For example, one exemplary implementation illustrated and described below provides for formation of a doped silicon overlying a deposited metal, where an anneal process concurrently diffuses dopants from the silicon into the metal while reacting the metal with the silicon to form the first metal silicide over the gate dielectric. In another alternative implementation, dopants are implanted through the silicon and into the underlying metal, after which a post-implant anneal is performed to react the metal and the silicon and thereby form the first silicide. The gate structures may be patterned at any suitable point in these implementations, such as before or after the anneal steps.

Figure 7B:
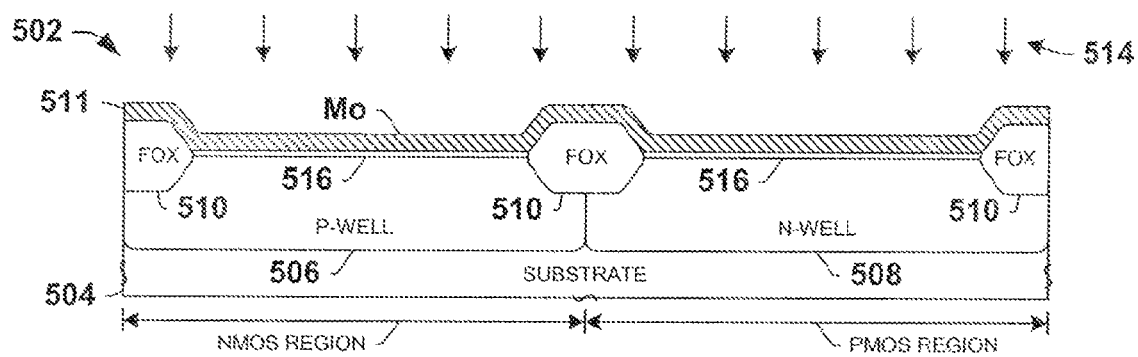
Figure 7C:
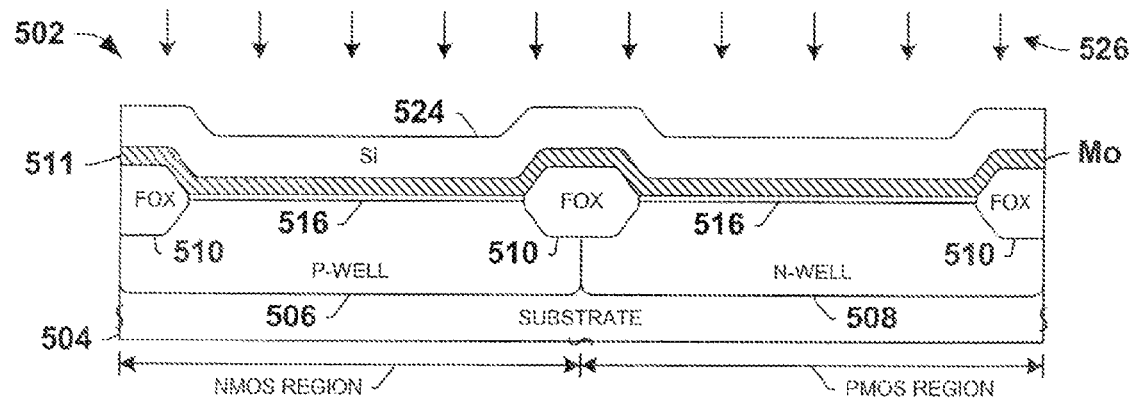
Figure 7D:
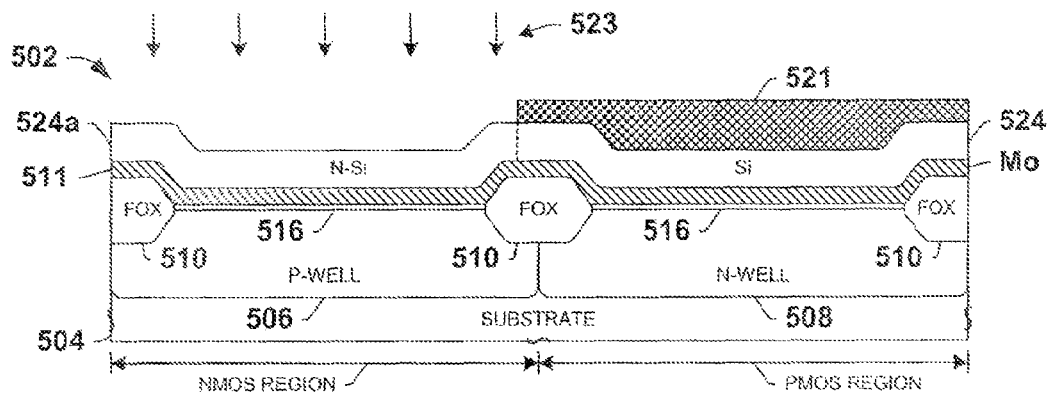
Figure 7E:
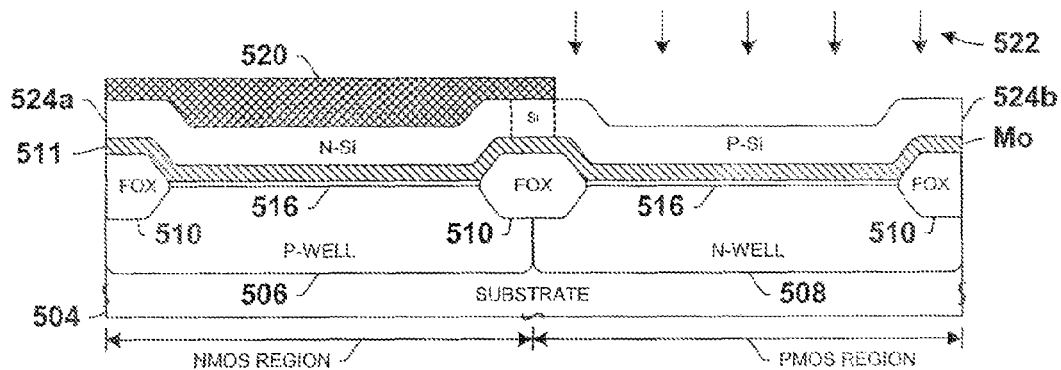
Figure 7F:
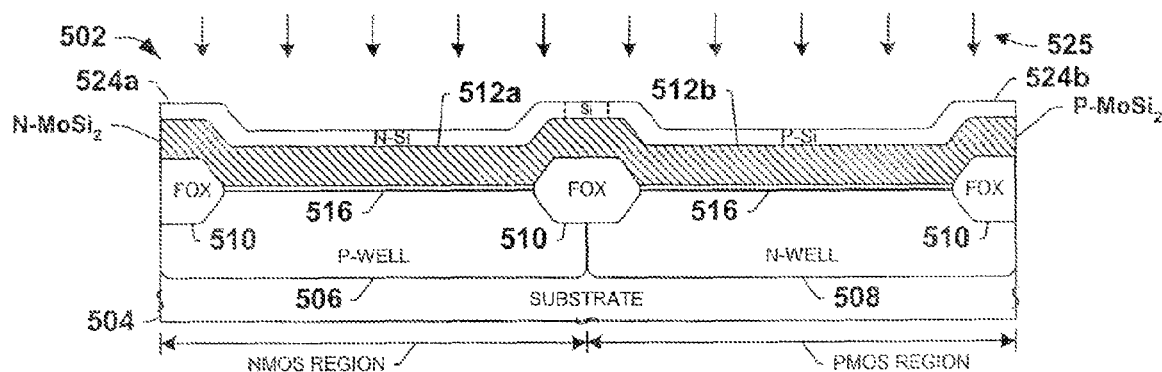

FIGS. 7A-7L illustrate another exemplary CMOS device 502 at various stages of fabrication processing generally according to the method 100 above. Fabrication of the NMOS and PMOS gate structures in the device 502 (e.g., 110 in FIG. 3) is illustrated in further detail in FIG. 6. A first metal 511 (e.g., refractory metal such as Mo, W, Ti, Ta, etc.) is deposited over the gate dielectric, along with an overlying silicon 524, wherein dopants are introduced into one or both of these materials prior to or concurrently with silicidation thereof. The completed transistor gates include first and second metal silicides 512 and 544a and an intervening silicon 524. FIGS. 7M-7O illustrate an alternate device 502a having gate structures with first and second metal silicides in a silicide bilayer with no intervening silicon in accordance with the invention.

The device 502 (FIG. 7A) includes a silicon substrate semiconductor body 504 with a p-well 506, an n-well 508, and field oxide isolation structures 510 formed during front-end processing (104 in FIG. 3). A gate dielectric 516 is then formed (106 in FIG. 3) over the surface of the substrate 504 in NMOS and PMOS active regions of the device 502, which can be a thermally grown $SiO_2$ oxide 516 or any other dielectric material formed by any suitable technique. Gate fabrication then proceeds in accordance with processing indicated generally as 110b in FIG. 6. In FIG. 7B, a refractory metal 511 (e.g., Mo, W, Ti, Ta, etc.) is deposited (e.g., 402 of FIG. 6) over the gate dielectric 516 in NMOS and PMOS regions of the device 502 via a deposition process 514, for example, sputter deposition or other suitable process. The first metal 511 can alternatively be a non-refractory metal and may be deposited or otherwise formed to any suitable thickness within the scope of the invention. In FIG. 7C, a layer of silicon 524 is deposited over the first metal 511 using a CVD deposition process 526 (404 in FIG. 6) to any desired thickness. In one possible implementation, the deposition process 526 is preferably adjusted such that the metal layer 511 and the deposited silicon layer 524 do not react to form a silicide layer at this process step.

Doping of the ultimately formed first metal silicide may be accomplished using any suitable technique within the scope of the invention, including direct implantation or diffusion ("DIRECT IMPLANT" or "DIFFUSION" at 406 in FIG. 6). In the exemplary device 502, diffusion is employed (e.g., 408-414 in FIG. 6). In FIG. 7D, a mask 521 is formed covering the PMOS regions and exposing the NMOS regions, and an implantation process 523 provides n-type dopants to the NMOS silicon, thereby creating n-doped silicon 524a over the first metal 511 (408 in FIG. 6). In FIG. 7E, the mask 521 is removed and a mask 520 is formed to cover the NMOS regions and expose the PMOS regions. An implantation process 522 is performed to introduce p-type dopants into the silicon in the PMOS region (410 in FIG. 6), thus creating p-doped silicon 524b over the first metal 511 in the PMOS region and the mask 520 is then removed. In FIG. 7F, an anneal process 525 is performed (412 in FIG. 6) to diffuse n and p-type dopants from the NMOS and PMOS silicon 524a and 524b, respectively, into the underlying first metal 511, and to concurrently react the silicon 524 and the metal 511 to form doped first metal silicide 512 in the NMOS and PMOS regions. As a result, n and p-doped first metal silicides 512a and 512b are created in the NMOS and PMOS regions, respectively, as shown in FIG. 7F.

Figure 7G:
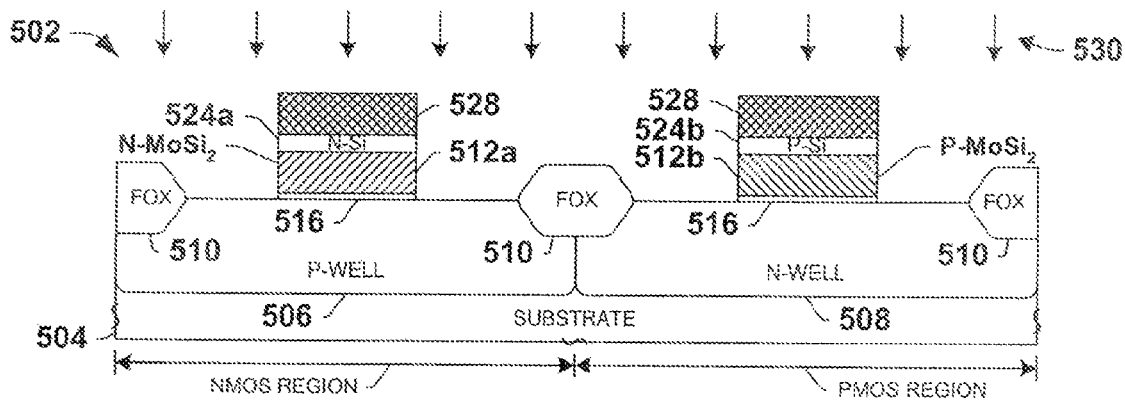
Figure 7H:
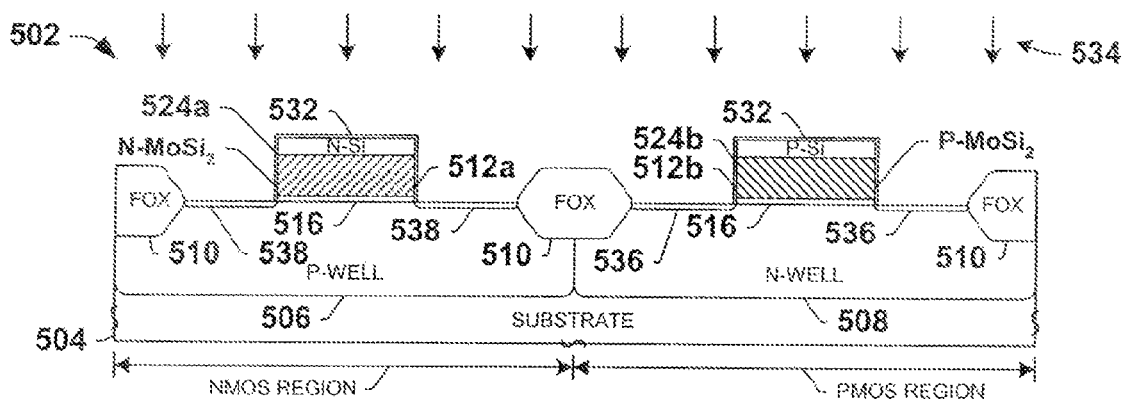
Figure 7I:
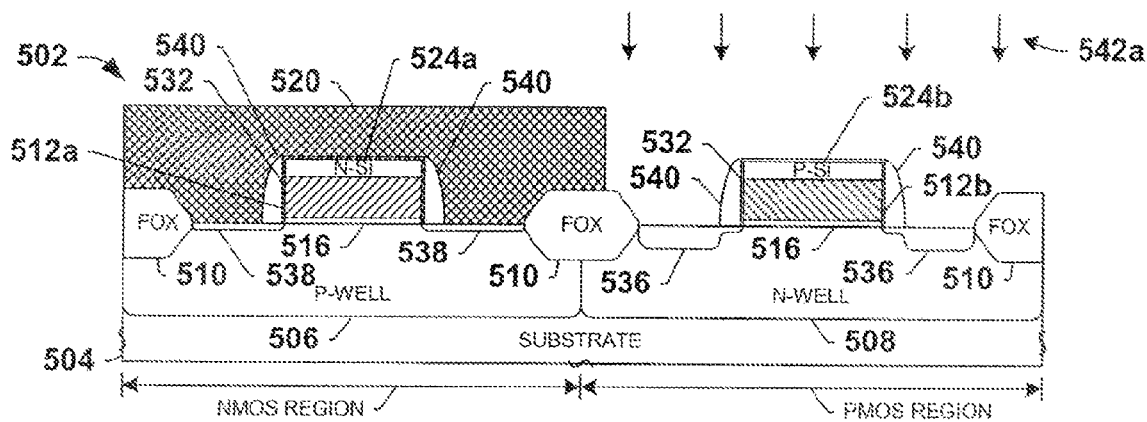

A mask 528 is formed in FIG. 7G and the silicon 524a, 524b and the first metal silicide 512 are patterned (414 in FIG. 6) via an etch process 530 to define patterned NMOS and PMOS gate structures, after which the mask 528 is removed. Alternatively, the layers can be patterned before annealing, although the illustrated example advantageously avoids gate structure shape changes during annealing by patterning after the anneal. In FIG. 7H, the patterned gate structures are encapsulated (120 In FIG. 3) with an encapsulation structure 532, and HDD implants 534 are performed (122 in FIG. 3) to provide p-type dopants in prospective PMOS source/drains 536 and n-type dopants in prospective NMOS source/drains 538. Sidewall spacers 540 are formed in FIG. 7I along the lateral sidewalls of the patterned gate structures (124 in FIG. 3), as well as a mask 520 covering the NMOS region. A p-type source/drain implant 542a is performed (126 in FIG. 3) to implant p-type impurities into the PMOS region, further defining the PMOS source/drains 536 and providing additional dopants to the PMOS gate stack silicon 524b.

Figure 7J:
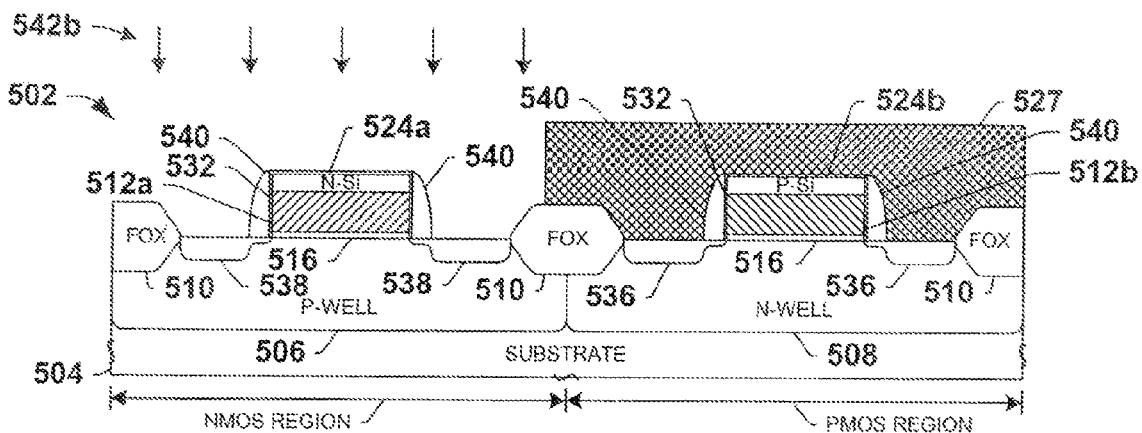
Figure 7K:
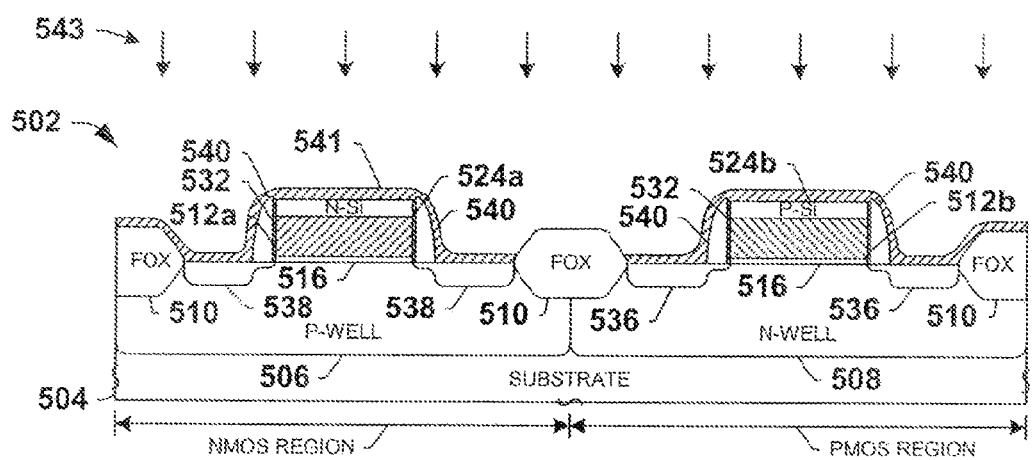
Figure 7L:
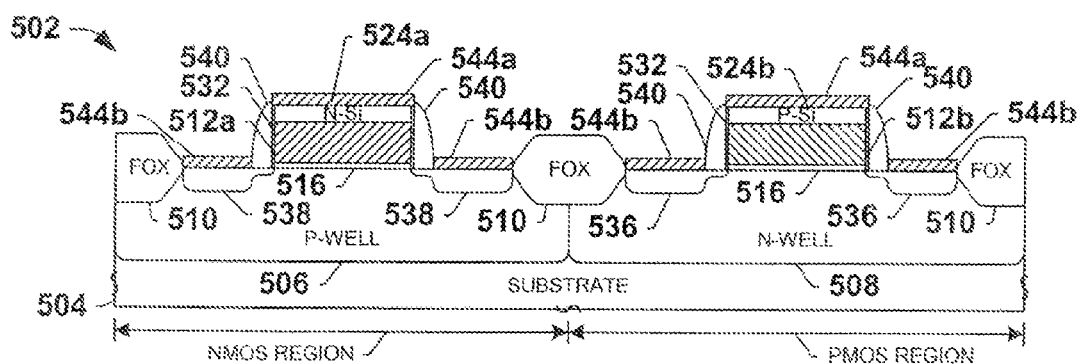
Figure 7M:
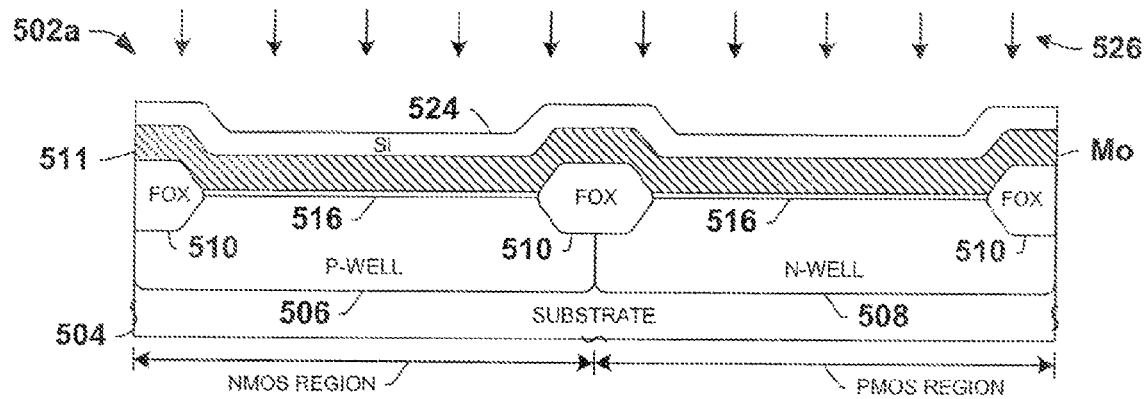
FIGS. 7M-7O are partial side elevation views in section illustrating exemplary NMOS and PMOS transistors undergoing CMOS processing at various stages of fabrication to form gate structures with first and second metal silicides in a silicide bilayer with no intervening silicon.
Figure 7N:
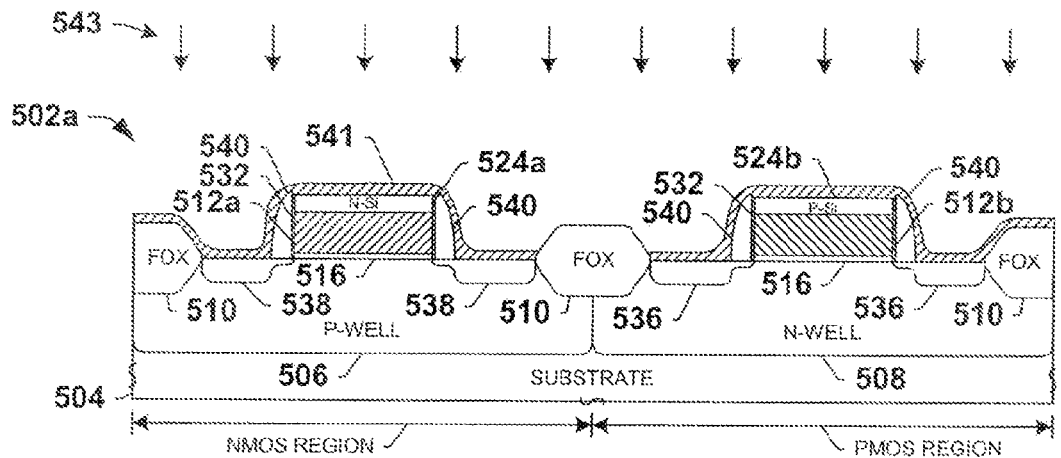
Figure 7O:
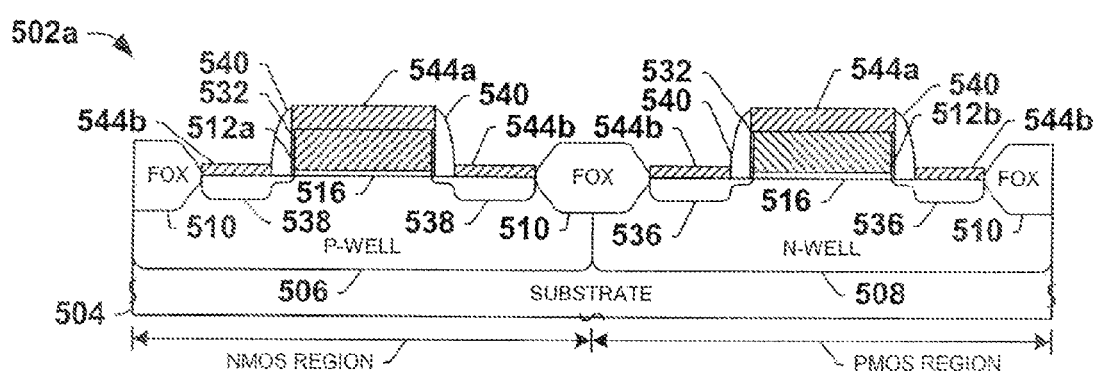

In FIG. 7J, the mask 520 is removed and a mask 527 is formed over the PMOS region. An n-type source/drain implant 542b is performed (128 in FIG. 3) to implant arsenic, phosphorus or other n-type impurities into the NMOS region, thus further defining the NMOS source/drains 538 and providing additional dopants to the NMOS gate stack silicon 524a. In FIGS. 7K and 7L, a second metal silicide 544a is formed (130 in FIG. 3) above the doped first metal silicide 512 and the silicon 524, and source/drain silicide contacts 544b are formed over the source drains 536 and 538. In FIG. 7K, a layer of nickel 541 is deposited over the silicon 524 and over the doped source/drains 536 and 538 of the substrate 504. An anneal 543 is performed to react the nickel 541 with the silicon 524 of the gate stacks, thereby forming a second metal silicide 544a above the remaining silicon 524 as seen in FIG. 7L, wherein the anneal 543 concurrently reacts the nickel 541 with the source/drain silicon 536 and 538 to form nickel silicide source/drain contacts 544b. Thereafter, any remaining (e.g., unreacted) nickel 541 is removed. Interconnect metalization and other back-end processing (not shown) is thereafter performed to complete the fabrication of the device 502 (132 in FIG. 3). As with the above examples, the second metal silicide 544a and the source/drain silicide contacts 544b may alternatively be formed by separate processes within the scope of the invention.

In FIGS. 7M-7O, an alternative device 502a is illustrated, having MOS gate structures comprising first and second metal silicides 512 and 544a in a silicide bilayer with no intervening silicon. In FIG. 7M, a first metal 511 is formed over the gate dielectric 516 and silicon 524 is deposited over the first metal 511. Following gate stack and source/drain fabrication as described above (e.g., including reaction of the metal 511 with the silicon 524 to form the first silicide 512), FIG. 7N illustrates deposition of nickel 541 over the remaining silicon 524 of the patterned NMOS and PMOS gate structures and over the source/drains 536, 538. An anneal 543 is performed to react the nickel 541 with the silicon 524 of the gate stacks, thereby forming a second metal silicide 544a, wherein the anneal consumes substantially all of the silicon 524 in the gate structures, as shown in FIG. 7O.

Referring again to FIG. 6, as an alternative to diffusion, the first metal 511 and/or the overlying silicon 524 may be doped by direct implantation (e.g., "DIRECT IMPLANT" at 406 in FIG. 6) following silicon formation within the scope of the invention. At 420, n-type dopants are implanted through the silicon and into the underlying first metal in the NMOS region, using any suitable masking and implantation processes. At 422, p-type dopants are implanted through the silicon and into the underlying first metal in the PMOS region, after which a post implant anneal is performed at 424 to react the silicon and the doped first metal, thus creating doped first metal silicide. The silicon may be partially or entirely consumed in the silicidation anneal at 424 within the scope of the invention. Thereafter, the first metal silicide and any remaining silicon are patterned at 426, and further fabrication processing is performed as described above.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating PMOS and NMOS gate structures in a semiconductor device, the method comprising:
forming a gate dielectric in PMOS and NMOS regions above a semiconductor body;
forming a first metal silicide of a first metal above and in direct physical contact with the gate dielectric in the NMOS region and the PMOS region;
doping the first metal silicide over the NMOS region with n-type dopant and doping the first metal silicide over the PMOS region with D-type dopant; and
forming a second metal silicide above the doped first metal silicide of a second metal different from the first metal in the NMOS and PMOS regions.

2. The method of claim 1, wherein forming a second metal silicide comprises:
depositing a metal layer and a silicon layer; and
reacting the metal with the silicon to form the second metal silicide.

3. The method of claim 2, wherein reacting the metal with the silicon depletes the silicon layer.

4. The method of claim 2, wherein the first metal silicide comprises one of molybdenum, tungsten, tantalum, and titanium.

5. The method of claim 2, wherein the second metal silicide comprises nickel.

6. The method of claim 1, wherein the first metal silicide comprises a refractory metal.

7. The method of claim 1, wherein the second metal silicide comprises nickel.

8. The method of claim 1, wherein the first metal silicide comprises one of molybdenum, tungsten, tantalum, and titanium.

9. The method of claim 1, wherein doping the first metal silicide over the NMOS region with n-type dopant and doing the first metal silicide over the PMOS region with p-type dopant comprises implanting n-type dopants into the first metal silicide in the NMOS region, and implanting p-type dopants into the first metal silicide in the PMOS region.

10. The method of claim 9, further comprising depositing a silicon layer over the first metal silicide followed by implanting n-type dopants into the first metal silicide in the NMOS region and implanting p-type dopants into the first metal silicide in the PMOS region.

11. The method of claim 1, wherein forming a first metal silicide comprises:
   depositing a first refractory metal over and in direct physical contact with the gate dielectric in the NMOS and PMOS regions;
   depositing a first silicon over the refractory metal in the NMOS and PMOS regions; and
   annealing the first metal and the first silicon to form metal silicide of the refractory metal in the NMOS and PMOS regions.

12. The method of claim 11, further comprising:
   depositing a second silicon over the first metal silicide:
   implanting n-type dopants into the second silicon in the NMOS region;
   implanting p-type dopants into the second silicon in the PMOS region; and
   annealing to drive n-type dopants from the second silicon into the first metal silicide in the NMOS region and to drive p-type dopants from the second silicon into the first metal silicide in the PMOS region.

13. The method of claim 12, wherein forming the second metal silicide comprises reacting the second silicon with a second metal above the first metal silicide in the NMOS and PMOS regions.

14. The method of claim 13, wherein reacting the second silicon with the second metal depletes the second silicon to form the second metal silicide over the first metal silicide.

15. The method of claim 11, wherein the first metal silicide comprises one of molybdenum, tungsten, tantalum, and titanium.

16. The method of claim 1, wherein forming a first metal silicide comprises:
   depositing a first metal over the gate dielectric in the NMOS and PMOS regions;
   depositing a first silicon over the first metal in the NMOS and PMOS regions;
   introducing n-type dopants into the first metal in the NMOS region;
   introducing p-type dopants into the first metal in the PMOS region; and
   followed by annealing the first metal and the first silicon.

17. The method of claim 16, wherein introducing dopants into the first metal comprises implanting n-type dopants through the silicon and into the first metal in the NMOS region, and implanting p-type dopants through the silicon and into the first metal in the PMOS region.

18. The method of claim 17, wherein the first metal is one of molybdenum, tungsten, tantalum, and titanium.

19. The method of claim 1, wherein forming a first metal silicide comprises:
   depositing the first metal over the gate dielectric in the NMOS and PMOS regions;
   depositing a first silicon over the first metal in the NMOS and PMOS regions;
   introducing n-type dopants into the first silicon in the NMOS region;
   introducing p-type dopants into the first silicon in the PMOS region; and
   followed by annealing the first metal and the first silicon.

20. The method of claim 19, wherein the first metal is a refractory metal.

* * * * *